(12) United States Patent
Ota et al.

(10) Patent No.: US 6,540,377 B1
(45) Date of Patent: Apr. 1, 2003

(54) FULL-COLOR LIGHT SOURCE UNIT

(75) Inventors: Koichi Ota, Aichi (JP); Koichi Kaga, Aichi (JP); Yuji Takahashi, Aichi (JP); Yoshinobu Suehiro, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 09/709,313

(22) Filed: Nov. 13, 2000

(30) Foreign Application Priority Data

Nov. 11, 1999 (JP) .............................. 11-320425
May 12, 2000 (JP) ......................... 2000-140772

(51) Int. Cl.[7] .................................................. F21V 9/00
(52) U.S. Cl. ....................... 362/231; 366/555
(58) Field of Search .................. 362/800, 551, 362/555, 558–559, 561, 227, 228, 230, 231; 315/185 R

(56) References Cited

U.S. PATENT DOCUMENTS

| | | | |
|---|---|---|---|
| 4,727,289 A | * | 2/1988 | Uchida ...................... 313/498 |
| 5,752,766 A | * | 5/1998 | Bailey et al. ............... 362/231 |
| 5,850,126 A | * | 12/1998 | Kanbar ...................... 315/200 A |
| 6,016,038 A | * | 1/2000 | Mueller et al. ............. 315/291 |
| 6,149,283 A | * | 11/2000 | Conway et al. ............. 362/236 |
| 6,184,628 B1 | * | 2/2001 | Ruthenberg ............. 315/185 R |
| 6,220,722 B1 | * | 4/2001 | Begemann .................. 362/226 |
| 6,234,645 B1 | * | 5/2001 | Börner et al. ............... 362/231 |

FOREIGN PATENT DOCUMENTS

| | | |
|---|---|---|
| EP | 751 340 A2 | 1/1997 |
| JP | 10-039301 | 2/1998 |
| JP | 10-319396 | 12/1998 |
| JP | 11-329044 | 11/1999 |
| KR | 10-0194845 | 11/1995 |

* cited by examiner

Primary Examiner—Sandra O'Shea
Assistant Examiner—Ismael Negron
(74) Attorney, Agent, or Firm—Pillsbury Winthrop LLP

(57) ABSTRACT

A light-emitting system has a base, and LEDs disposed on a front surface of the base. The alignment of the LEDs includes a first group of LEDs each having first and second electrodes on a light-emitting surface side, and a second group of LEDs each having a first electrode on the light-emitting surface side and a second electrode on the base side. The first group of LEDs and the second group of LEDs are arranged alternately in a line on the front surface of the base. The first group of LEDs includes at least one blue LED and green LEDs larger in number than the blue LED. The second group of LEDs includes red LEDs larger in number than the blue LED. A full-color light source unit is provided that includes the first and second groups of LEDS.

30 Claims, 16 Drawing Sheets

FULL-COLOR LIGHT SOURCE UNIT

BACKGROUND OF THE INVENTION

1. Field of the Invention

The present invention relates to a full-color light source unit. Particularly, it relates to a full-color light source unit that can exhibit various color tones efficiently freely. Moreover, it relates to an improvement of a unit to be suitably used also as a white light source for back-lighting or front-lighting of a full-color liquid-crystal panel.

The present application is based on Japanese Patent Applications Nos. Hei. 11-320425 and 2000-140772, which are incorporated herein by reference.

2. Description of the Related Art

Use of LEDs emitting three primary colors (RGB) of light as a full-color light source is known generally. In such a general full-color light source, one red LED, one green LED and one blue LED were packed in one package. Such a full-color light source can emit desired-color light as well as white light under suitable control on the respective LEDs.

For example, a surface light source disclosed in JP-A-10-319396 is used as a white light source for a liquid-crystal panel. In the surface light source, a blue LED is used as a light source. The blue LED is arranged in an end portion of a first rod-like light guide plate. The first light guide plate is attached to a light entrance surface of a second panel-like light guide plate. A layer of a color conversion member made of a fluorescent material is formed in a portion of the first light guide plate opposite to the light entrance surface of the second light guide plate. The color conversion member absorbs blue light emitted from the blue LED and emits yellow light. As a result, the yellow light emitted from the color conversion member and the blue light emitted from the blue LED are mixed together to synthesize white light. The white light is made incident into the second panel-like light guide plate. Thus, the second light guide plate serves as a white surface light source for back-lighting of a liquid-crystal panel.

The white light emitted from the white surface light source disclosed in JP-A-10-319396 is, however, a mixture of the blue light emitted from the blue LED and the yellow light emitted from the fluorescent material. Hence, it is difficult to develop red when full-color display is to be achieved by liquid crystal. This is because the white light contains a slight amount of red light component. Moreover, there is a problem in the durability of the fluorescent material because the fluorescent material is apt to change with the passage of time compared with LED. Moreover, 100% of the light emitted from the blue LED does not appear on a light-emitting surface and a conversion loss occurs in the conversion of the blue light into the yellow light because the blue light emitted from the blue LED is mixed with the yellow light due to the conversion of a part of the blue light. Hence, there is also a problem that sufficient light-emitting efficiency cannot be obtained. In addition, the tone of color cannot be changed.

According to a general full-color light source using LEDs with three primary colors (RGB) of light, full-color light containing a sufficient amount of red light component can be generated. If white light developed by such a full-color light source is used for back-lighting of a full-color liquid-crystal panel, red can be expressed sufficiently even in the full-color liquid-crystal panel. Therefore, the inventors of the present invention have made investigation and investigation into a full-color light source using RGB LEDs efficiently and the use of the full-color light source for lighting of a full-color liquid-crystal panel. As a result, the inventors have found the following problem.

In characteristic of currently generally available LEDs, a green or red LED is inferior in the light emission output (Luminance) to a blue LED. For example, in a full-color light source unit having one blue LED, one green LED and one red LED, therefore, it was necessary to suppress the output of the blue LED to balance with the outputs of the green and red LEDs.

Such balance, however, makes efficiency worse because the blue LED cannot emit light with full power. Particularly in a white surface light source to be used in a portable apparatus, such balance is undesirable because high efficiency is required from the point of view of power consumption saving.

Further, another problem which the inventors have found will be described.

JP-A-11-329044 discloses a background-art light-emitting system for back-lighting of a full-color liquid-crystal panel.

The light-emitting system comprises a row of LED chips, and a light guide portion for receiving light from the row of LED chips through an incident surface of the light guide portion and making the light propagate through the inside of the light guide portion to thereby make surface-like back-lighting beams exit from an exit surface of the light guide portion. The row of LED chips are constituted by red (R), green (G) and blue (B) LEDs. Each of the R, G and B LEDs has a narrow-band emission spectrum. Hence, when the R, G and B LEDs are made to emit light, R, G and B light components emitted from the LEDs are mixed to get her so that the liquid-crystal panel can be irradiated with white back-lighting beams.

According to the background-art light-emitting system using light-emitting devices with three colors R, G and B, however, the number of wire-bonding points became so large that the light-emitting devices could not be mounted compactly because each of the G and B light-emitting devices had positive and negative electrodes on the light-emitting surface side. Hence, the distance between adjacent ones of the light-emitting devices became so large that it was difficult to achieve a point light source. Moreover, improvement in color balance was limited. Moreover, when the light-emitting devices were increased in number, the total heating value became so large that the output power is lowered, the life of the light-emitting system is shortened, etc.

SUMMARY OF THE INVENTION

An object of the present invention is to provide a full-color light source unit that can exhibit various color tones efficiently freely.

Another object of the present invention is to provide a light-emitting system in which reduction in size can be made in the case of use of a plurality of light-emitting devices to thereby make improvement in color balance possible.

Still another object of the present invention is to provide a light-emitting device in which lowering of output power and shortening of the life of the light-emitting system can be avoided in the case of use of a plurality of light-emitting devices.

In order to achieve the above objects, according to an aspect of the present invention, there is provided a light-emitting system comprising a plurality of light-emitting devices mounted on a substrate, wherein: the plurality of light-emitting devices include a first group of light-emitting devices and a second group of light-emitting devices, each of the first group of light-emitting devices having first and second electrodes on a light-emitting surface side, each of the second group of light-emitting devices having a first electrode on the light-emitting surface side and a second electrode on a side opposite to the light-emitting surface side; and the first group of light-emitting devices and the second group of light-emitting devices are arranged alternately in a line on the substrate.

According to the aforementioned configuration in which the first group of light-emitting devices each having two electrodes on the light-emitting surface side and the second group of light-emitting devices each having one electrode on the light-emitting surface side and one electrode on the substrate side are arranged alternately on the substrate, the light-emitting devices can be mounted compactly because the light-emitting devices can be connected easily by bonding wires even in the case where the light-emitting devices are arranged densely. Incidentally, the concept "substrate" used herein includes a printed-circuit board in which leads to be connected to the first and second electrodes are printed on the board by a circuit-printing technique, a lead frame-structural substrate formed by a technique in which an electrically insulating material is injected into a mold in the condition that a lead frame corresponding to the leads to be connected to the first and second electrodes is arranged in the mold, etc. The concept "light-emitting device" means a bare chip such as an LED provided with first and second electrodes.

According to another aspect of the present invention, there is provided a light-emitting system comprising a plurality of light-emitting devices mounted on a substrate, wherein: the substrate includes a common lead being common to the light-emitting devices, and individual leads being peculiar to the light-emitting devices respectively, the common and individual leads being formed as predetermined patterns on a front surface of an electrically insulating base; and each of the common lead and the individual leads has a portion extended to one side surface of the electrically insulating base.

According to the aforementioned configuration, the heat-radiating area of the light-emitting system increases as a whole because each of the leads to be connected to the light-emitting devices is extended from a front surface of the substrate to a side surface of the substrate.

According to a further aspect of the present invention, there is provided a light-emitting system comprising a plurality of light-emitting devices mounted on a substrate, wherein: the light-emitting devices include a first group of light-emitting devices capable of emitting light with a predetermined heating value, and a second group of light-emitting devices capable of emitting light with a heating value smaller than the predetermined heating value; and the first group of light-emitting devices and the second group of light-emitting devices are arranged in a line on the substrate so that the first group of light-emitting devices are not adjacent to one another.

According to the aforementioned configuration, heat generated by the plurality of light-emitting devices can be dispersed.

According to a still further aspect of the present invention, there is provided a light-emitting system comprising a plurality of light-emitting devices mounted on a substrate, wherein: the light-emitting devices include a first group of light-emitting devices with a predetermined height, and a second group of light-emitting devices with a height lower than the predetermined height; and the first group of light-emitting devices and the second group of light-emitting devices are arranged in a line on the substrate so that the first group of light-emitting devices are not adjacent to one another.

According to the aforementioned configuration, light radiation from one member in the first group of light-emitting devices to the outside can be prevented from being disturbed by other members in the first group of light-emitting devices.

The present invention has been attained to solve the problem and the configuration thereof is as follows.

That is, a full-color light source unit comprises: at least one blue LED; green LEDs larger in number than the blue LED; and red LEDs larger in number than the blue LED.

According to the full-color light source unit configured as described above, green LEDs and red LEDs low in light emission output are set to be larger in number than the blue LED high in light emission output. Hence, white light can be generated while the outputs of the respective LEDs are balanced with one another without any limitation on the output of the blue LED. Hence, there is no lowering of efficiency in light emission.

The respective numbers of blue, green and red LEDs are not particularly limited. In consideration of the demand for miniaturization on the liquid-crystal panel, it is preferable that the full-color light source unit comprises one blue LED, two green LEDs, and two red LEDs. According to the inventors÷ investigation, it has been found that optimum white light is obtained in the aforementioned combination of currently available LED when the respective LEDs are made to emit light with nearly full power.

It is preferable that the green LEDs are made equal in number to the red LEDs.

It is preferable that a bare chip type LED is used as each of the LEDs and that all the LEDs are packed in a package (housing).

From the necessity for bonding work, or the like, a predetermined distance is taken between adjacent ones of the LEDs in the full-color light source unit. Hence, the full-color light source unit cannot emit white light directly. White light can be only obtained when light components emitted from the respective LEDs in the full-color light source unit are mixed together in a light mixing portion. It has been realized that the arrangement of the respective LEDs must be considered in this occasion so that the light components emitted from the respective LEDs can be mixed efficiently in the light mixing portion or in other words the light components can be mixed sufficiently even in a small-size light mixing portion.

It is first necessary that the blue LED smallest in number and highest in single output is placed in the center of the arrangement of LEDs. The "arrangement of LEDs" includes so-called linear arrangement in which LEDs are arranged in a line, so-called planar arrangement in which LEDs are arranged radially or two-dimensionally to cover all over a plane, and so-called volumetric arrangement in which LEDs are arranged three-dimensionally. Incidentally, in consideration of the fact that a light entrance surface of a surface light source to be used for back-lighting or front-lighting of a liquid-crystal panel is shaped like a narrow plane, it is preferable that LEDs are arranged in a line in accordance with the shape of the light entrance surface.

In the arrangement of LEDs, it is preferable that green LEDs and red LEDs are arranged symmetrically with respect to the blue LED disposed as the center of the arrangement. That is, when B, G and R express a blue LED, a green LED and a red LED respectively, the following arrangement patterns are used preferably.

(Arrangement Pattern 1) G-R-B-R-G (Arrangement Pattern 2) R-G-B-G-R

Of these, the arrangement pattern 1 is especially preferred. Both positive and negative electrodes are provided on the upper surface of each of general blue and green LEDs whereas only one electrode is provided on the upper surface of each of general red LEDs. This is because in consideration of wire-bonding workability and proximate arrangement of LEDs with avoiding crossing of wires, it is preferable that red LEDs small in the number of electrodes are arranged on the side as near to the center as possible.

From the point of view of facilitation of wire-bonding work, or the like, the following LED arrangement pattern may be used.

(Arrangement Pattern 3) R-R-B-G-G

Besides the aforementioned LED bare chips, a wiring portion for wiring the LEDs, a transparent resin for enclosing the LEDs, a housing, etc. are provided in the full-color light source unit. Bonding pads are provided in the wiring portion. The bonding pads are wire-bonded to the electrodes of the LEDs respectively. The wiring portion further has a connector, by which the respective LEDs are electrically connected to external power supply lines and control lines.

The full-color light source unit is combined with a light mixing portion to constitute a full-color light source.

That is, light components emitted from the respective LEDs of the full-color light source unit are mixed together in the light mixing portion to thereby generate various kinds of light. The light mixing portion is made of a light-transmissible material (such as methacrylic resin, polycarbonate, or the like). The light mixing portion has a light entrance surface in which light components emitted from the respective LEDs are incident, a mixing means for mixing the incident light components, and a light-emitting surface for emitting the mixed light. The light mixing portion may be made of lens-like glass or resin with which the respective LEDs are merely covered and which condenses and mixes light. Alternatively, the light mixing portion may be made of glass or resin containing a light scattering material.

Further, the light mixing means may be constituted by a portion 115 having a light scattering material and/or a portion 111 having a light reflection surface 113 as described in the tenth embodiment (see FIGS. 16A to 16C) of the present invention. The light reflection surface is obtained by surface roughening such as etching, sandblasting, electric discharging, or the like, or by white-printing or by white tape-sticking.

A surface light source is constituted by a combination of the full-color light source and a surface light guide portion.

The surface light guide portion is made of a light-transmissible material (such as methacrylic resin, polycarbonate, or the like). The surface light guide portion is shaped like a plate corresponding to a liquid-crystal panel. The surface light guide portion has a light entrance surface and a light-emitting surface through which light is transmitted. Other surfaces of the surface light guide portion than these surfaces are preferably provided as reflection surfaces. The reflection surfaces are formed by surface roughening such as etching, sandblasting, electric discharging, or the like, or by white-printing or by white tape-sticking. There is also an effect that light components emitted from the respective LEDs and transmitted through the light mixing portion are further mixed through the reflection surfaces. Preferably, the reflectivity of the reflection surfaces is set to increase as the location in the reflection surfaces becomes farther from the light entrance surface. That is, it is preferable that light is emitted uniformly from the light-emitting surface. Moreover, preferably, gradient may be given to the thickness of the surface light guide portion (the thickness of the light entrance surface side may be thickened) as described in the eight embodiment (see FIGS. 14A to 14C) of the present invention so that light made incident into the surface light guide portion from the light entrance surface is reflected efficiently toward the light-emitting surface.

Features and advantages of the invention will be evident from the following detailed description of the preferred embodiments described in conjunction with the attached drawings.

DETAILED DESCRIPTION OF THE PREFERRED EMBODIMENTS

Figure 1A:
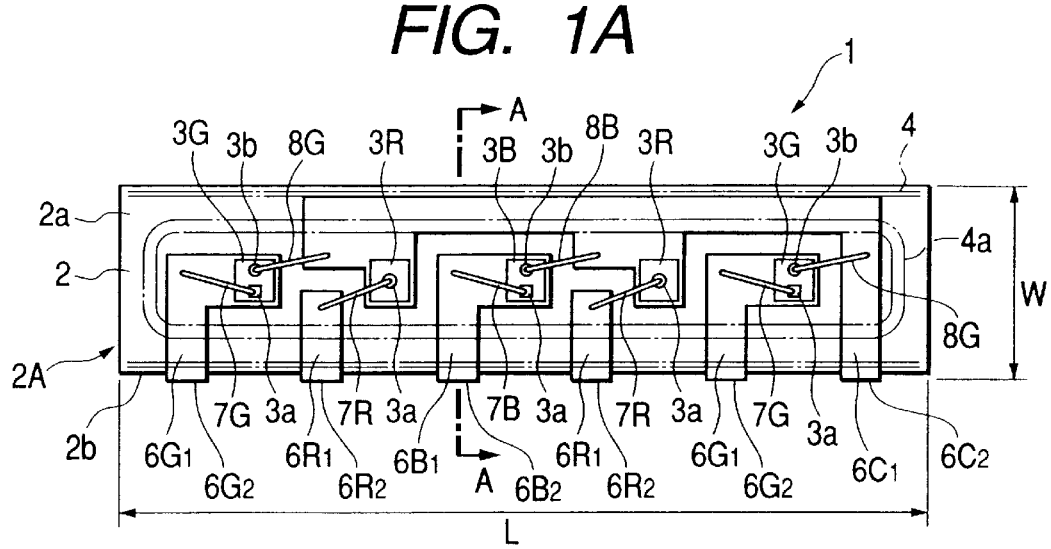
FIG. 1A is a plan view showing a light-emitting system according to a first embodiment of the present invention.
Figure 1B:
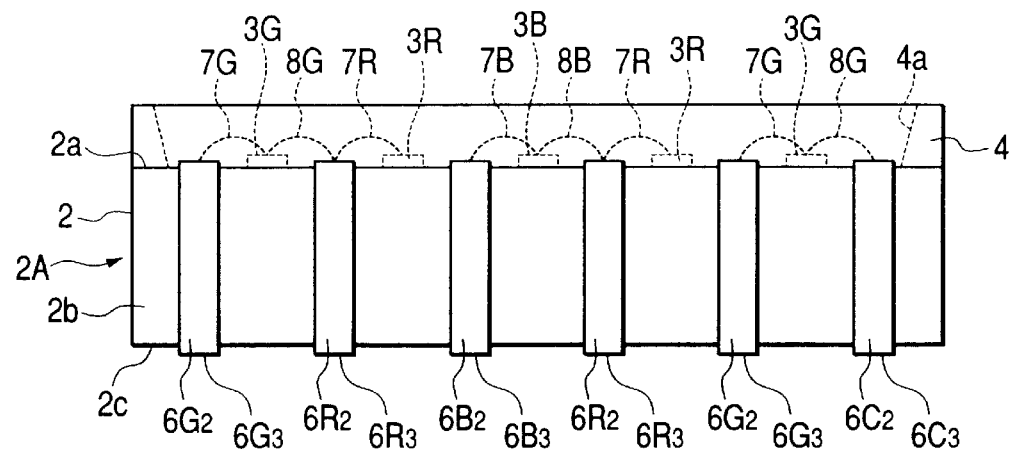
FIG. 1B is a front view of the light-emitting system.
Figure 1C:
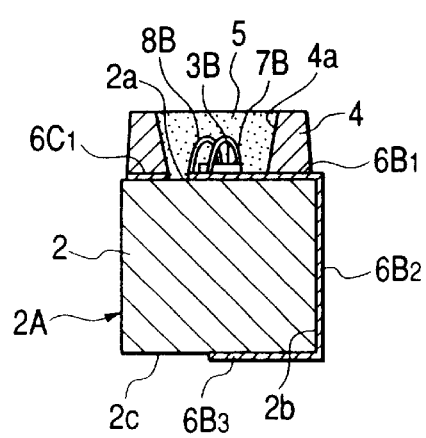
FIG. 1C is a sectional view taken along the line A—A in FIG. 1A.

FIGS. 1A to 1C show a light-emitting system according to a first embodiment of the present invention. Specifically, FIG. 1A shows the case where a housing and a filler member are omitted for the sake of easy understanding. FIG. 1C is a sectional view taken along the line A—A in FIG. 1A. The light-emitting system 1 has a printed-circuit board 2A on which metal patterns are printed so that LEDs can be mounted on the board, a plurality of LEDs 3 (3R, 3G and 3B) aligned or arranged in a line on a front surface 2a of the printed-circuit board 2A, a housing 4 having an opening portion 4a provided so as to surround the alignment of LEDs 3, and a filler member 5 made of a transparent epoxy resin for sealing the alignment of LEDs 3 and filling the opening portion 4a of the housing 4.

The printed-circuit board 2A includes a base 2 made of a material excellent in heat resistance and white reflectivity such as a mixture of a glass epoxy resin and a white colorant excellent in white reflectivity, and metal patterns printed on a front surface 2a of the base 2 so as to serve as individual leads 6R, 6G and 6B for R, G and B and a common lead 6C common to the LEDs 3. The respective leads 6R, 6G, 6B and 6C are constituted by electrode faces $6R_1$, $6G_1$, $6B_1$ and $6C_1$ formed on the front surface 2a of the base 2, extended portions $6R_2$, $6G_2$, $6B_2$ and $6C_2$ formed on a side surface 2b of the base 2, and connection portions $6R_3$, $6G_3$, $6B_3$ and $6C_3$ formed on a bottom surface 2c of the base 2. The electrode faces $6R_1$, $6G_1$ and $6B_1$ for R, G and B respectively are formed in regions between adjacent ones of the LEDs 3. Each of the electrode faces $6G_1$ and $6B_1$ or G and B respectively is shaped like an "L" figure. The side surface 2b of the base 2 serves as a surface to be mounted on a light-emitting system mounting substrate which will be described later. The connection portions $6R_3$, $6G_3$, $6B_3$ and $6C_3$ are connected to wiring patterns formed on the light-emitting system mounting substrate.

The alignment of LEDs 3 includes a blue LED 3B arranged in the center, two red LEDs 3R and 3R arranged on the outsides of the blue LED, and two green LEDs 3G and 3G arranged on the outsides of the red LEDs. For example, each of the red LEDs 3R is made of an InGaAlP (indium-gallium-aluminum-phosphorus) semiconductor capable of emitting red light. Each of the red LEDs 3R has a first electrode 3a on its upper surface and a second electrode on its lower surface. The first electrode 3a on the upper surface is electrically connected to the electrode face $6R_1$ of a corresponding individual lead 6R for R by a bonding wire 7R. The second electrode on the lower surface is electrically and mechanically connected to the electrode face $6C_1$ of the common lead 6C by an electrically conductive adhesive agent. For example, each of the green LEDs 3G is made of a GaN (gallium nitride) semiconductor capable of emitting green light. Each of the green LEDs 3G has first and second electrodes 3a and 3b on its upper surface. The lower surface of each of the green LEDs 3G is mechanically connected to the electrode face $6G_1$ of a corresponding individual lead 6G for G by an adhesive agent. The first electrode 3a is electrically connected to the electrode face $6G_1$ of the individual lead 6G for G by a bonding wire 7G. The second electrode 3b is electrically connected to the electrode face $6C_1$ of the common S lead 6C by a bonding wire 8G. For example, the blue LED 3B is made of a GaN (gallium nitride) semiconductor capable of emitting blue light. The blue LED 3B has first and second electrodes 3a and 3b on its upper surface. The lower surface of the blue LED 3B is mechanically connected to the electrode face $6B_1$ of a corresponding individual lead 6B for B by an adhesive agent. The first electrode 3a is electrically connected to the electrode face 6B of the individual lead 6B for B by a bonding wire. The second electrode 3b is electrically connected to the electrode face $6C_1$ of the common lead 6C by a bonding wire 8B. For example, single LEDs 3R, 3G and 3B for R, G and B have a light intensity ratio of 1:3:1. Hence, when the numbers of blue LEDs 3B, red LEDs 3R and green LEDs 3G to be used are set to be 1, 2 and 3 respectively as described above, an optimum light intensity ratio of R, G and B (for example, R:G:B=2:6:1) is obtained for mixing R, G and B light components to generate white light.

The housing 4 is made of a white resin such as a mixture of polycarbonate and a white colorant high in white reflectivity. The housing 4 is provided so that the housing 4 is attached to the printed-circuit board 2A after the printed-circuit board 2A inclusive of the alignment of LEDs 3 is mounted on the light-emitting system mounting substrate which will be described later. Incidentally, a combination of a resin and a white coating composition applied onto the opening portion 4a may be used as the housing 4.

In the light-emitting system 1 in the first embodiment, a group of LEDs 3G and 3B each having first and second electrodes 3a and 3b on the light-emitting surface side and a group of LEDs 3R each having a first electrode on the light-emitting surface side and a second electrode on the base 2 side are arranged alternately on the printed-circuit board 2A. Hence, the LEDs 3R, 3G and 3B can be arranged compactly because the LEDs. 3R, 3G and 3B can be connected easily by the bonding wires 7R, 7G, 7B, 8G and 8B even in the case where the LEDs 3R, 3G and 3B are arranged densely. As a result, a point light source can be provided easily, so that improvement in color balance can be achieved.

Moreover, white and full-color light good in light intensity balance of blue, green and red and good in efficiency can be obtained by one package.

Moreover, efficient light emission can be made because the blue LED 3B can be made to emit light with full power when R G and B light components are mixed together to generate white light.

Moreover, reduction in size in the direction of the width W can be achieved because the leads 6R, 6G, 6B and 6C are formed in regions between adjacent ones of the LEDs 3.

Moreover, the heat-radiating area of the light-emitting system increases as a whole because each of the leads 6R, 6G, 6B and 6C is extended from the front surface 2a to the side surface 2b or to the bottom surface 2c as well as it is disposed on the front surface 2a. Hence, lowering of output power, shortening of the life of the light-emitting system, etc. caused by the temperature rise of the LEDs 3 can be avoided. Moreover, the light-emitting system can be mounted on the light-emitting system mounting substrate easily.

Moreover, light can be reflected with a high reflectivity with respect to all emission wavelengths of R, G and B because each of the base 2 and the housing 4 is made of a material high in white reflectivity. Hence, light-emitting efficiency can be enhanced, so that power saving can be achieved.

Moreover, an inexpensive small-size light-emitting system can be provided because the printed-circuit board 2A that can be produced inexpensively with small size is used.

Figure 2A:
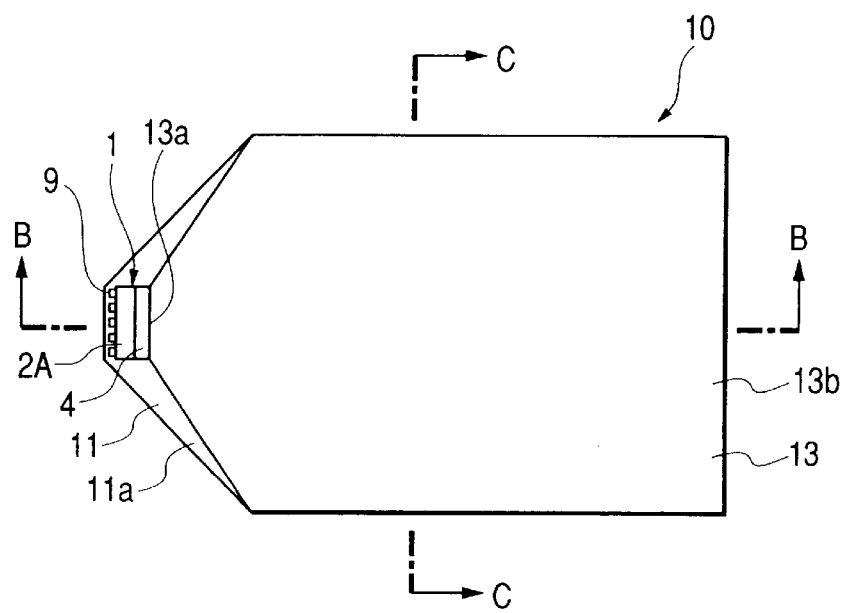
FIG. 2A is a plan view showing an example in which the light-emitting system according to the first embodiment is applied to a back-lighting unit.
Figure 2B:
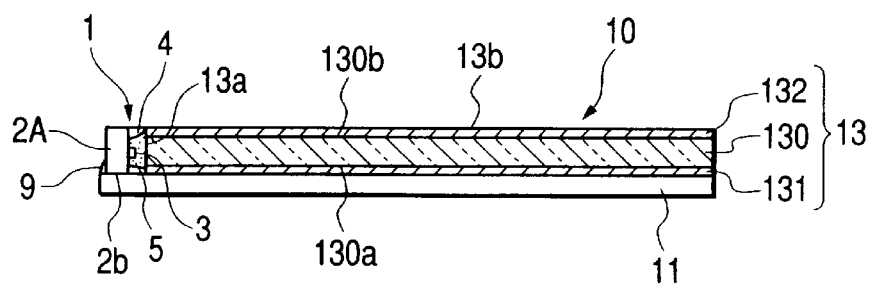
FIG. 2B is a sectional view taken along the line B—B in FIG. 2A.
Figure 2C:
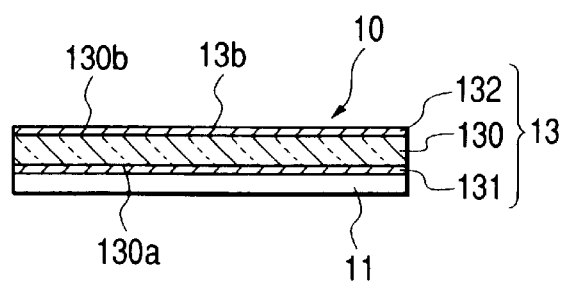
FIG. 2C is a sectional view taken along the line C—C in FIG. 2A.

FIGS. 2A to 2C show an example in which the light-emitting system 1 in this embodiment is applied to a unit for back-lighting of a full-color liquid-crystal panel. FIG. 2B is a sectional view taken along the line B—B in FIG. 2A. FIG. 2C is a sectional view taken along the line C—C in FIG. 2A. The back-lighting unit 10 has a light-emitting system mounting substrate 11 having an LED drive circuit with wiring patterns formed on its front surface 11a, a light-emitting system 1 provided on one end portion of the light-emitting system mounting substrate 11 and having leads 6R, 6G, 6B and 6C connected to the wiring patterns formed on the light-emitting system mounting substrate 11, and a light guide portion 13 for receiving light from the light-emitting system 1 through its incident face 13a and making the light propagate through its inside to thereby output the light as surface-like white back-lighting beams from its exit surface 13b.

The light guide portion 13 includes a light guide plate 130, a reflection plate 131, and a diffusing plate 132. The light guide plate 130 is made of a transparent material such as polycarbonate, acrylate or glass. The reflection plate 131 is provided on a rear surface 130a of the light guide plate 130 and made of a white film of poltethylene terephthalate, or the like. The reflection plate 131 is provided for reflecting light emitted from the light-emitting system 1 and received through the incident face 13a. The diffusing plate 132 is provided on a front surface 130b of the light guide plate 130 and made of a film of polycarbonate, or the like, having roughness on the exit surface 13b. The diffusing plate 132 is provided for diffusing light received from the light-emitting system 1 through the incident face 13a and reflected through the reflection plate 131.

Figure 3:
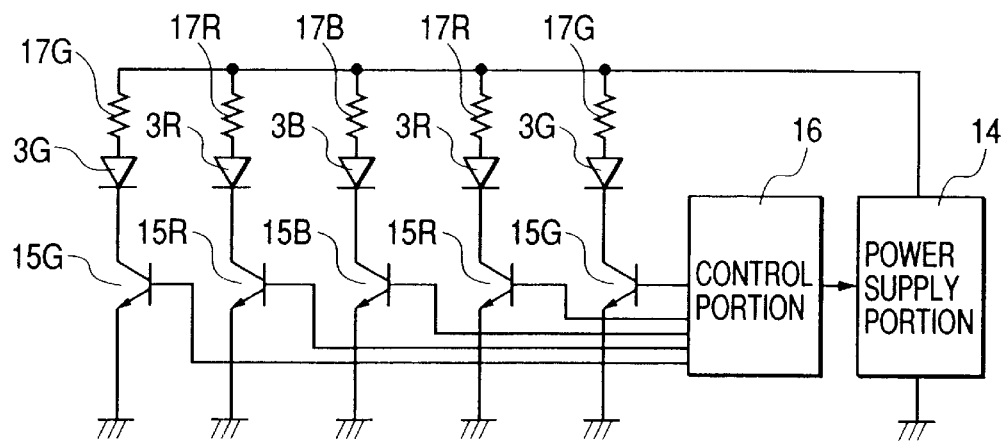
FIG. 3 is a diagram showing a circuit for driving LEDs in the light-emitting system according to the first embodiment.

FIG. 3 shows the LED drive circuit formed on the light-emitting system mounting substrate 11. As shown in FIG. 3, the LED drive circuit has a power supply portion 14, and a control portion 16. The power supply portion 14 is provided for applying a drive voltage to each of anodes of the LEDs 3R, 3G and 3B. The control portion 16 is connected to cathodes of the LEDs 3R, 3G and 3B through transistors 15R, 15G and 15B and control resistors 17R, 17G and 17G respectively. The control portion 16 is provided for controlling light emission of the LEDs 3R, 3G and 3B and controlling the power supply portion 14. Hence, the LEDs 3R, 3G and 3B can be made to emit light separately as well as the LEDs 3R, 3G and 3B can be made to emit light simultaneously to generate a white back-lighting beam. When, for example, any two LEDs selected from the LEDs 3R, 3G and 3B are made to emit light in combination, light can be emitted with seven kinds or more of colors in total.

The light-emitting system 1 is incorporated into the back-lighting unit 10 as follows. First, the light-emitting system 1 is mounted on the light-emitting system mounting substrate 11 in the condition that the housing 4 and the filler member S are not yet provided. That is, the connection portions $6R_3$, $6G_3$, $6B_3$ and $6C_3$ of the individual and common leads 6R, 6G, 6B and 6C on the light-emitting system 1 are connected to the wiring patterns on the front surface 11a of the light-emitting system mounting substrate 11 by solder 9. Then, the housing 4 is bonded to the front surface 2a of the LED-mounting printed-circuit board 2A by an adhesive agent. The opening portion 4a of the housing 4 is filled with the filler member 5 while the LEDs 3R, 3G ad 3B are sealed with the filler member 5. Then, the light guide portion 13 is mounted on the light-emitting system mounting substrate 11.

According to the back-lighting unit 10 configured as described above, white light can be diffused into the light guide plate 130 uniformly because the LEDs 3 with respective colors are arranged densely to achieve a state imitating a point light source. As a result, diffusion uniformity can be secured so that the minimum luminance is kept to be not smaller than 60% of the maximum luminance. Hence, color irregularity in the full-color liquid-crystal panel can be prevented.

Moreover, reduction in thickness of the back-lighting unit 10 can be achieved because the width W of the light-emitting system 1 can be reduced.

Moreover, the light-emitting system 1 can be mounted on the light-emitting system mounting substrate 11 easily because the light-emitting system 1 can be mounted on the light-emitting system mounting substrate 11 in the condition that the housing 4 is not yet provided.

Figure 4:
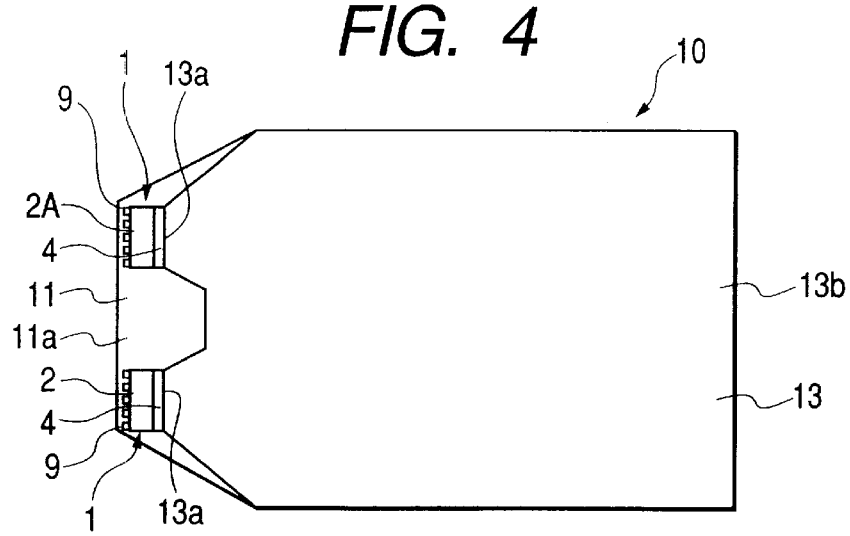
FIG. 4 is a plan view showing another example in which the light-emitting system according to the first embodiment is applied to a back-lighting unit.

FIG. 4 shows a modified example of the back-lighting unit 10 shown in FIG. 2. The back-lighting unit 10 shown in FIG. 4 is configured in the same manner as in FIG. 2 except that the light guide portion 13 has two incident faces 13a provided on one side and that two light-emitting systems 1 are provided on the two incident faces 13a respectively. According to the back-lighting unit 10, light-emitting characteristic more uniform in the direction of the width can be obtained.

Figure 5:
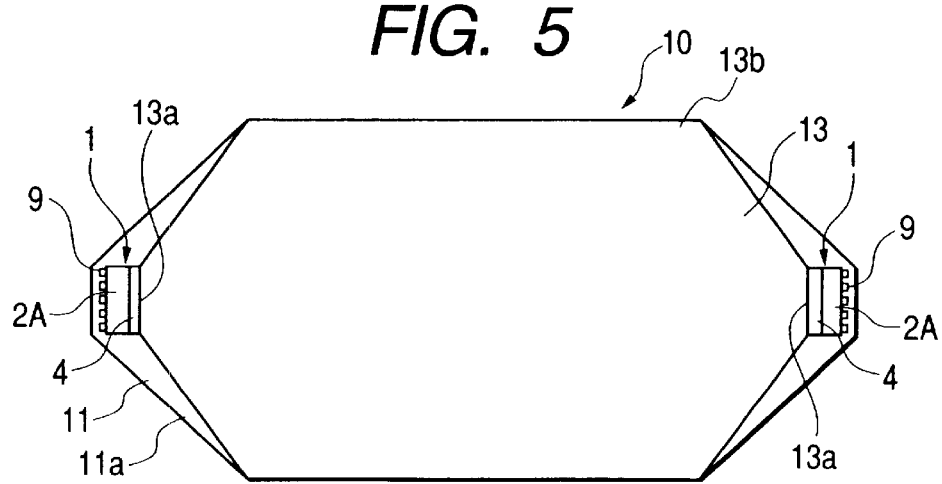
FIG. 5 is a plan view showing a further example in which the light-emitting system according to the first embodiment is applied to a back-lighting unit.

FIG. 5 shows a modified example of the back-lighting unit 10 shown in FIG. 2. The back-lighting unit 10 shown in FIG. 5 is configured in the same manner as in FIG. 2 except that the light guide portion 13 has two incident faces 13a provided on the opposite sides and that two light-emitting systems 1 are provided on the two incident faces 13a respectively. According to the back-lighting unit 10, light-emitting characteristic more uniform in the direction of the length can be obtained.

Figure 6A:
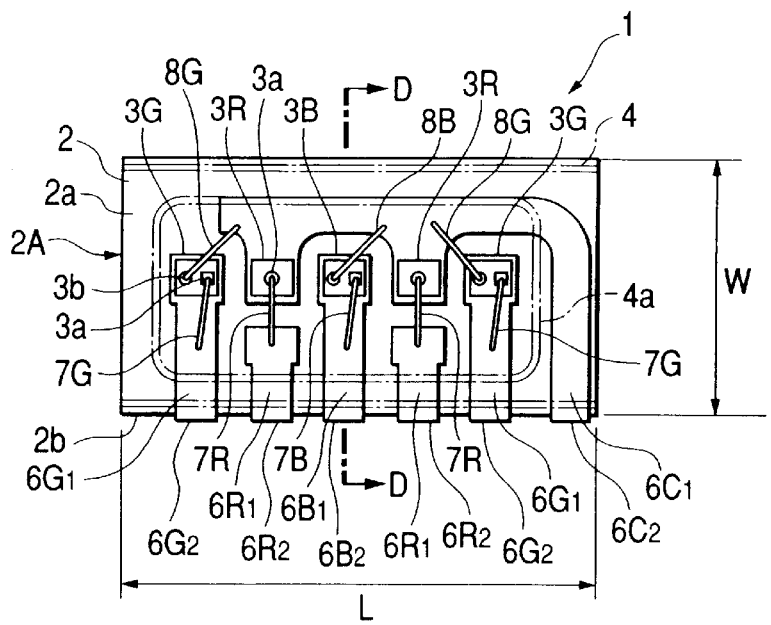
FIG. 6A is a plan view showing a light-emitting system according to a second embodiment of the present invention.
Figure 6B:
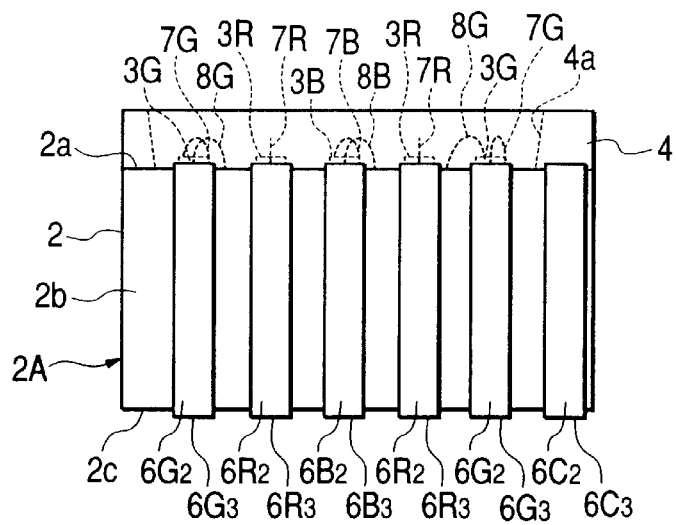
FIG. 6B is a front view of the light-emitting system.
Figure 6C:
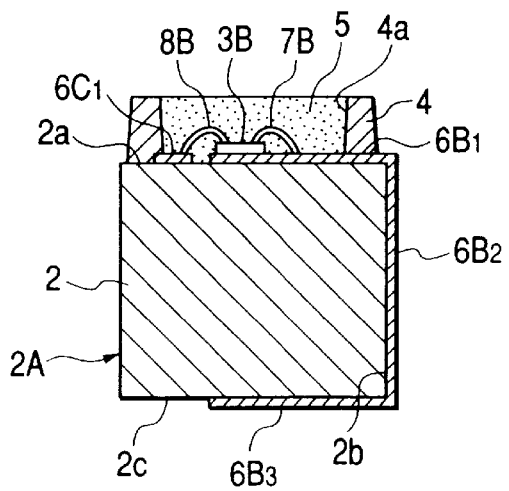
FIG. 6C is a sectional view taken along the line D—D in FIG. 6A.

FIGS. 6A to 6C show a light-emitting system according to a second embodiment of the present invention. FIG. 6A shows the case where the housing 4 and the filler member 5 are omitted for the sake of easy understanding. FIG. 6C is a sectional view taken along the line D—D in FIG. 6A. The light-emitting system 1 according to the second embodiment is configured in the same manner as in the first embodiment except that the LEDs 3R, 3G and 3B are arranged so that the first and second electrodes 3a and 3b of the LEDs 3R, 3G and 3B are aligned and that the individual leads 6R ($6R_1$, $6R_2$ and $6R_3$), 6G ($6G_1$, $6G_2$ and $6G_3$) and 6B ($6B_1$, $6B_2$ and $6B_3$) are formed in regions perpendicular to the LEDs 3R, 3G and 3B respectively.

According to the second embodiment, the pitch of arrangement of the LEDs 3R, 3G and 3B in the direction of the length of the light-emitting system can be shortened. Hence, the light-emitting system can be formed to imitate a point light source more sufficiently compared with the first embodiment. Moreover, the length L of the light-emitting system can be shortened.

Figure 7A:
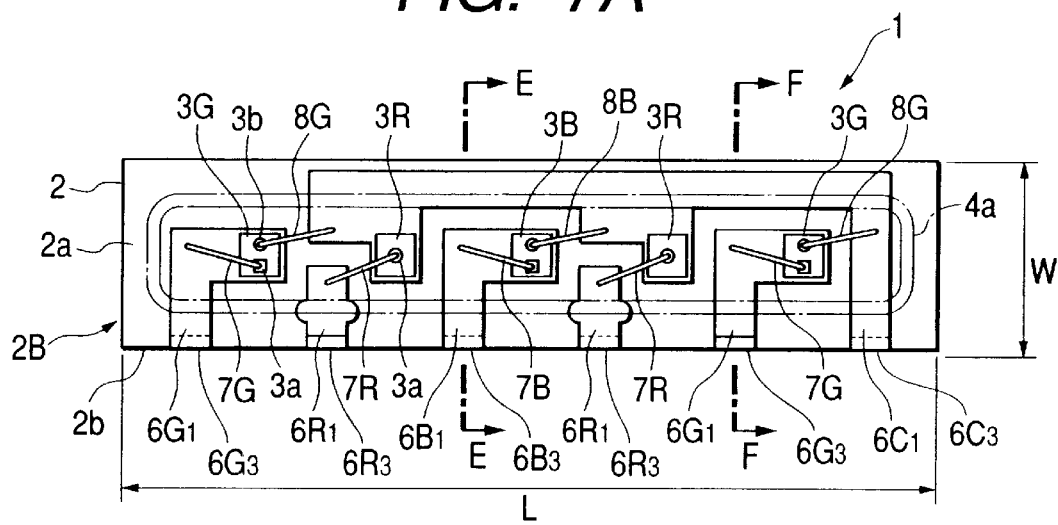
FIG. 7A is a plan view showing a light-emitting system according to a third embodiment of the present invention.
Figure 7B:
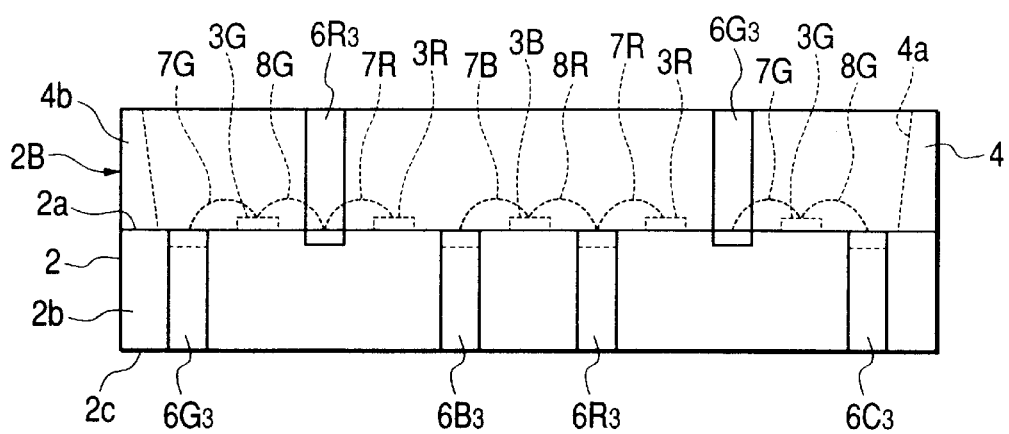
FIG. 7B is a front view of the light-emitting system.
Figure 7C:
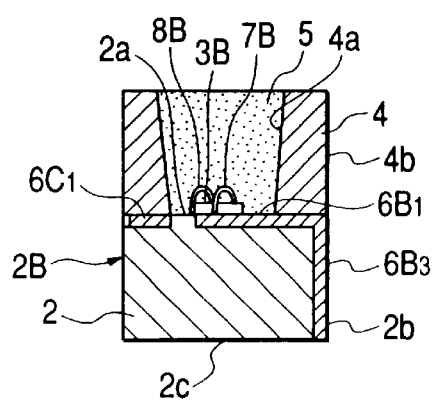
FIG. 7C is a sectional view taken along the line E—E in FIG. 7A.
Figure 7D:
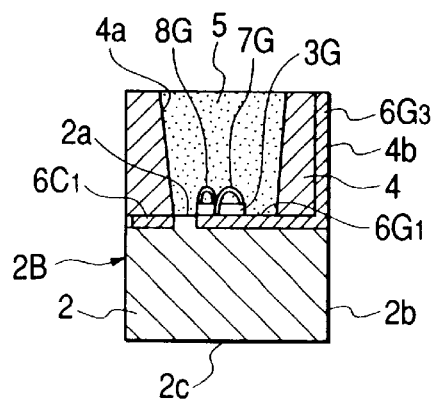
FIG. 7D is a sectional view taken along the line F—F in FIG. 7A.

FIGS. 7A to 7D show a light-emitting system according to a third embodiment of the present invention. Incidentally, FIG. 7A shows the case where the housing 4 and the filler member 5 are omitted for the sake of easy understanding. FIG. 7C is a sectional view taken along the line E—E in FIG. 7A. FIG. 7D is a sectional view taken along the line F—F in FIG. 7A. The light-emitting system 1 according to the third embodiment is configured in the same manner as in the first embodiment except that the printed-circuit board 2A in the first embodiment is replaced by a lead frame-structural substrate 2B and that the housing 4 is made of the same material as the base 2.

The lead frame-structural substrate 2B includes a base 2 made of a material excellent in heat resistance and white reflectivity in the same manner as in the first embodiment, individual leads 6R, 6G and 6B for R, G and B, and a common lead 6C common to the LEDs 3. The individual and common leads 6R, 6G, 6B and 6C are assembled when the base 2 and the housing 4 are insert-molded. The leads 6R, 6G, 6B and 6C are constituted by electrode faces $6R_1$, $6G_1$, $6B_1$ and $6C_1$ formed on a front surface 2a of the base 2, and connection portions $6R_3$, $6G_3$, $6B_3$ and $6C_3$ formed on a side surface 2b of the base 2 respectively. The connection portions $6R_3$ and $6G_3$ of the leads 6R and 6G are formed to extend on the housing 4 side. The leads 6R, 6G, 6B and 6C are formed as follows. A lead frame is arranged in a mold. A material of the base 2 and the housing 4 is injected into the mold to thereby mold the base 2 and the housing 4. Then, the lead frame is cut and bent into a predetermined shape. Thus, the leads 6R, 6G, 6B and 6C are formed.

When the light-emitting system 1 is to be installed in the back-lighting unit as shown in FIG. 4, the connection portions $6R_3$, $6G_3$, $6B_3$ and $6C_3$ formed on the side surface 2b of the base 2 having the housing 4 and the filler member 5 are connected to the wiring patterns on the light-emitting system mounting substrate 11 by solder to thereby mount the light-emitting system 1 on the light-emitting system mounting substrate 11.

According to the third embodiment, the work of attaching the housing 4 after mounting of the light-emitting system 1 on the light-emitting system mounting substrate 11 is not required when the light-emitting system 1 is installed in the back-lighting unit 10. Hence, the light-emitting system 1 can be mounted easily.

Moreover, a package excellent in heat resistance can be obtained because the leads 6R, 6G, 6B and 6C of the lead frame-structural substrate 2B can serve as a heat sink.

Figure 8A:
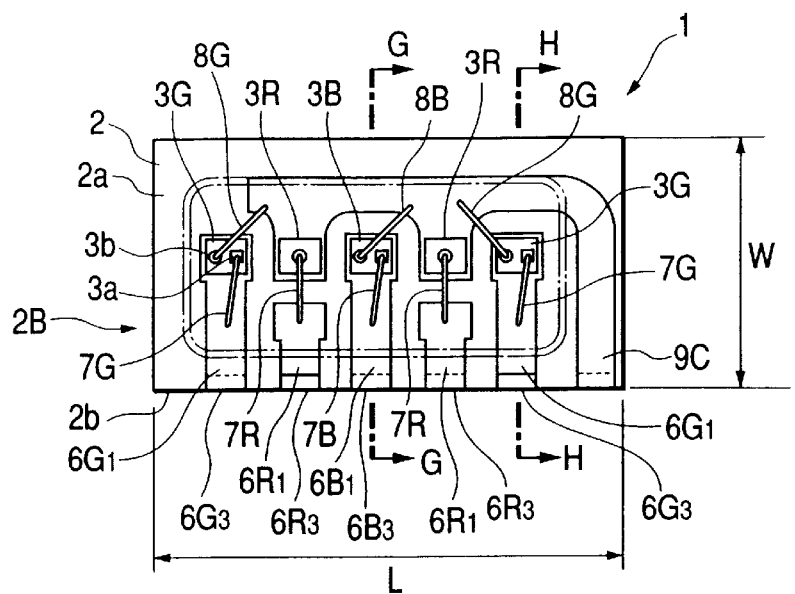
FIG. 8A is a plan view showing a light-emitting system according to a fourth embodiment of the present invention.
Figure 8B:
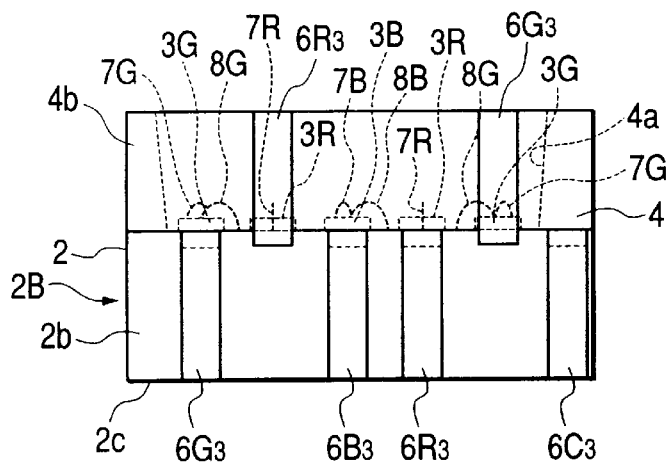
FIG. 8B is a front view of the light-emitting system.
Figure 8C:
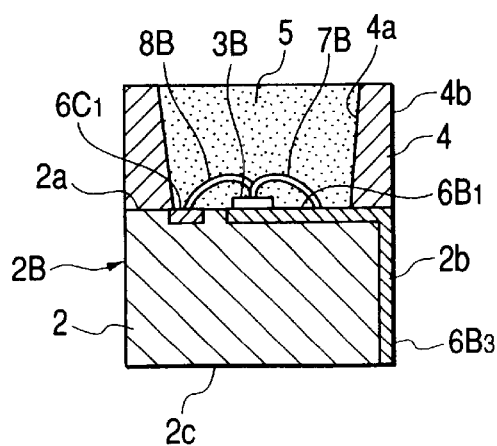
FIG. 8C is a sectional view taken along the line G—G in FIG. 8A.
Figure 8D:
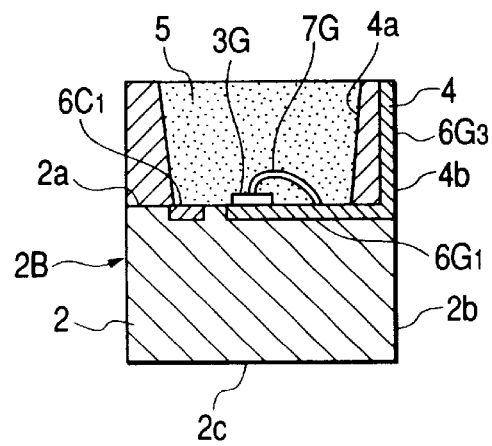
FIG. 8D is a sectional view taken along the line H—H in FIG. 8A.

FIGS. 8A to 8D show a light-emitting system according to a fourth embodiment of the present invention. Incidentally, FIG. 8A shows the case where the housing 4 and the filler member 5 are omitted for the sake of easy understanding. FIG. 8C is a sectional view taken along the line G—G in FIG. 8A. FIG. 8D is a sectional view taken along the line H—H in FIG. 8A. The light-emitting system 1 according to the fourth embodiment is configured in the same manner as in the third embodiment shown in FIG. 7 except that the LEDs 3R, 3G and 3B are arranged so that the first and second electrodes of the LEDs 3R, 3G and 3B are aligned as shown in FIG. 6 and that the individual leads 6R ($6R_1$, $6R_2$ and $6R_3$), 6G ($6G_1$, $6G_2$ and $6G_3$) and 6B ($6B_1$, $6B_2$ and $6B_3$) are formed in regions perpendicular to the LEDs 3R, 3G and 3B respectively.

According to the fourth embodiment, the pitch of arrangement of the LEDs 3R, 3G and 3B in the direction of the length of the light-emitting system can be shortened like the second embodiment. Hence, the light-emitting system can be formed to imitate a point light source more sufficiently. Moreover, the work of attaching the housing 4 after mounting of the light-emitting system 1 on the light-emitting system mounting substrate 11 is not required like the third embodiment. Hence, the light-emitting system 1 can be mounted easily.

The first, second, third and fourth embodiments have been described upon the case where a plurality of light-emitting devices are arranged in a line. However, the present invention may be applied also to the case where light-emitting devices are arranged into any other shape such as a multi-row shape, a zigzag shape or a circular shape so long as a first group of light-emitting devices each having two electrodes on the light-emitting surface side and a second group of light-emitting devices each having one electrode on the light-emitting surface side and one electrode on the substrate side are arranged alternately on the substrate to facilitate connection owing to bonding wires when the plurality of light-emitting devices are arranged densely. Light-emitting devices emitting light with one color may be used as all the light-emitting devices mounted on the substrate. The light-emitting devices may be arranged so that the first group of light-emitting devices each having two electrodes on the light-emitting surface side is constituted by one blue light-emitting device and one or more green light-emitting devices whereas the second group of light-emitting devices each having one electrode on the light-emitting surface side and one electrode on the substrate side is constituted by two or more red light-emitting devices. For example, a combination of one blue LED 3B, three green LEDs 3G and three red LEDs 3R, a combination of one blue LED 3B, three green LEDs 3G and two red LEDs 3R, a combination of one blue LED 3B, two green LEDs 3G and two red LEDs 3R or a combination of one blue LED 3B, one green LED 3G and two red LEDs 3R may be used.

Figure 9:
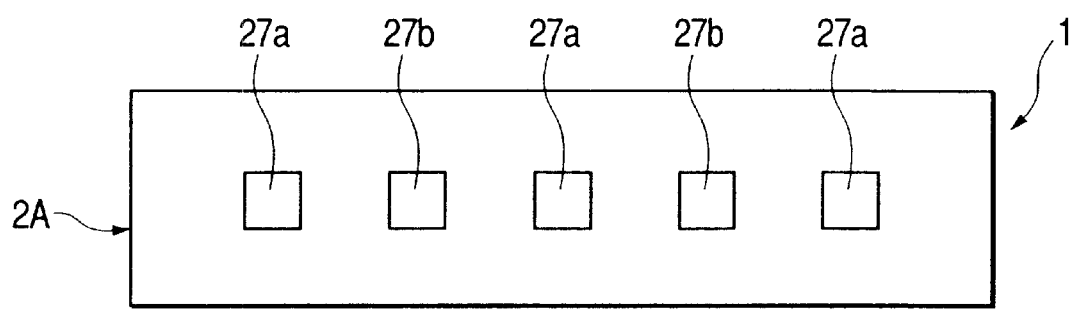
FIG. 9 is a plan view showing a light-emitting system according to a fifth embodiment of the present invention.

FIG. 9 shows a light-emitting system according to a fifth embodiment of the present invention. Incidentally, leads, bonding wires, etc. are not shown in FIG. 9. The light-emitting system 1 according to the fifth embodiment is configured so that LEDs 27a large in heating value and LEDs 27b small in heating value are arranged alternately on the printed-circuit board 2A along the direction of the length thereof. For example, the LEDs 27a large in heating value are GaN semiconductor LEDs capable of emitting blue or green light. For example, the LEDs 27b small in heating value are InGaAlP semiconductor LEDs capable of emitting red light.

According to the fifth embodiment, lowering of output power, shortening of the life of the light-emitting system, etc. caused by the temperature rise of the LEDs 27a and 27b can be avoided because heat generated by the LEDs 27a and 27b can be dispersed. Incidentally, the LEDs 27a and 27b may be arranged into any other shape such as a multi-row shape, a zigzag shape or a circular shape if the LEDs 27a large in heating value can be arranged so as not to be adjacent to one another. The respective numbers of the LEDs 27a and 27b are not limited to this embodiment. For example, the LEDs 27a and 27b may be arranged in order of (S)-(S)-(L)-(S)-(S), (L)-(S)-(S)-(S)-(L), (L)-(S)-(S)-(L), or the like, when (L) represents an LED 27a large in heating value and (S) represents an LED 27b small in heating value.

Figure 10:
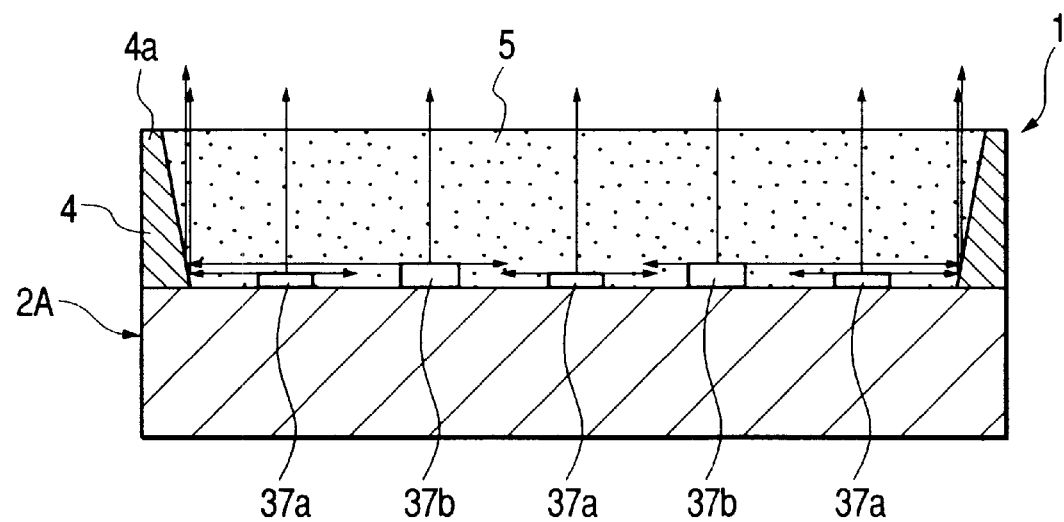
FIG. 10 is a vertical sectional view showing a light-emitting system according to a sixth embodiment of the present invention.

FIG. 10 shows a light-emitting system according to a sixth embodiment of the present invention. Incidentally, leads, bonding wires, etc. are not shown in FIG. 10. The light-emitting system 1 according to the sixth embodiment is configured so that LEDs 37a low in height and LEDs 37b high in height are arranged alternately on the printed-circuit board 2A along the direction of the length thereof. For example, the LEDs 37a low in height are 0.1 mm-height GaN semiconductor LEDs capable of emitting blue or green light. For example, the LEDs 37a high in height are 0.25 mm-height InGaAlP semiconductor LEDs capable of emitting red light.

According to the sixth embodiment, light from the low-height LED 37a located at each end can be reflected at the opening portion 4a of the housing 4 and radiated to the outside without being disturbed by the high-height LEDs 37b. At the same time, light from the high-height LED 37b can be reflected at the opening portion 4a of the housing 4 and radiated to the outside without being disturbed by the other LEDs 37a and 37b. Hence, radiating efficiency can be improved. Incidentally, the LEDs 37a and 37b may be arranged into any other shape such as a multi-row shape, a zigzag shape or a circular shape if the high-height LEDs 37b can be arranged so as not to be adjacent to one another. The numbers of the LEDs 37a and 37b are not limited to this embodiment. For example, the LEDs 37a and 37b may be arranged in order of (h)-(l)-(h)-(l)-(h), (l)-(l)-(h)-(l)-(l), (l)-(h)-(l), or the like, when (l) represents an LED 37a low in height and (h) represents an LED 37b high in height.

As described above, in the light-emitting system according to the present invention, a first group of light-emitting devices each having two electrodes on a light-emitting surface side and a second group of light-emitting devices each having one electrode on the light-emitting surface side and one electrode on a substrate side are arranged alternately on a substrate. Hence, even in the case where the light-emitting devices are arranged densely, the light-emitting devices can be connected easily by bonding wires. Hence, the light-emitting devices can be mounted compactly. As a result, a point light source can be provided easily, so that improvement in color balance can be achieved.

Moreover, the heat-radiating area of the light-emitting system increases as a whole because individual leads connected to the light-emitting devices are extended from a front surface of the substrate to a side surface of the substrate. Hence, lowering of output power, shortening of the life of the light-emitting system, etc. caused by the temperature rise of the light-emitting devices can be avoided. Moreover, the light-emitting system can be mounted easily on the light-emitting system mounting substrate.

Moreover, when a first group of light-emitting devices large in heating value and a second group of light-emitting devices small in heating value are used, the first group of light-emitting devices and the second group of light-emitting devices are arranged in a line on the substrate so that the first group of light-emitting devices are not adjacent to one another. Hence, heat generated from the plurality of light-emitting devices can be dispersed, so that lowering of output power, shortening of the life of the light-emitting system, etc. caused by the temperature rise of the light-emitting devices can be avoided.

Moreover, when a first group of light-emitting devices high in height and a second group of light-emitting devices low in height are used, the first group of light-emitting devices and the second group of light-emitting devices are arranged in a line on the substrate so that the first group of light-emitting devices are not adjacent to one another. Hence, radiation of light from one light-emitting device in the first group of light-emitting devices to the outside can be prevented from being disturbed by the other light-emitting devices in the first group. Hence, improvement in color balance can be achieved.

Next, the seventh embodiments of the present invention will be described below.

Figure 11:
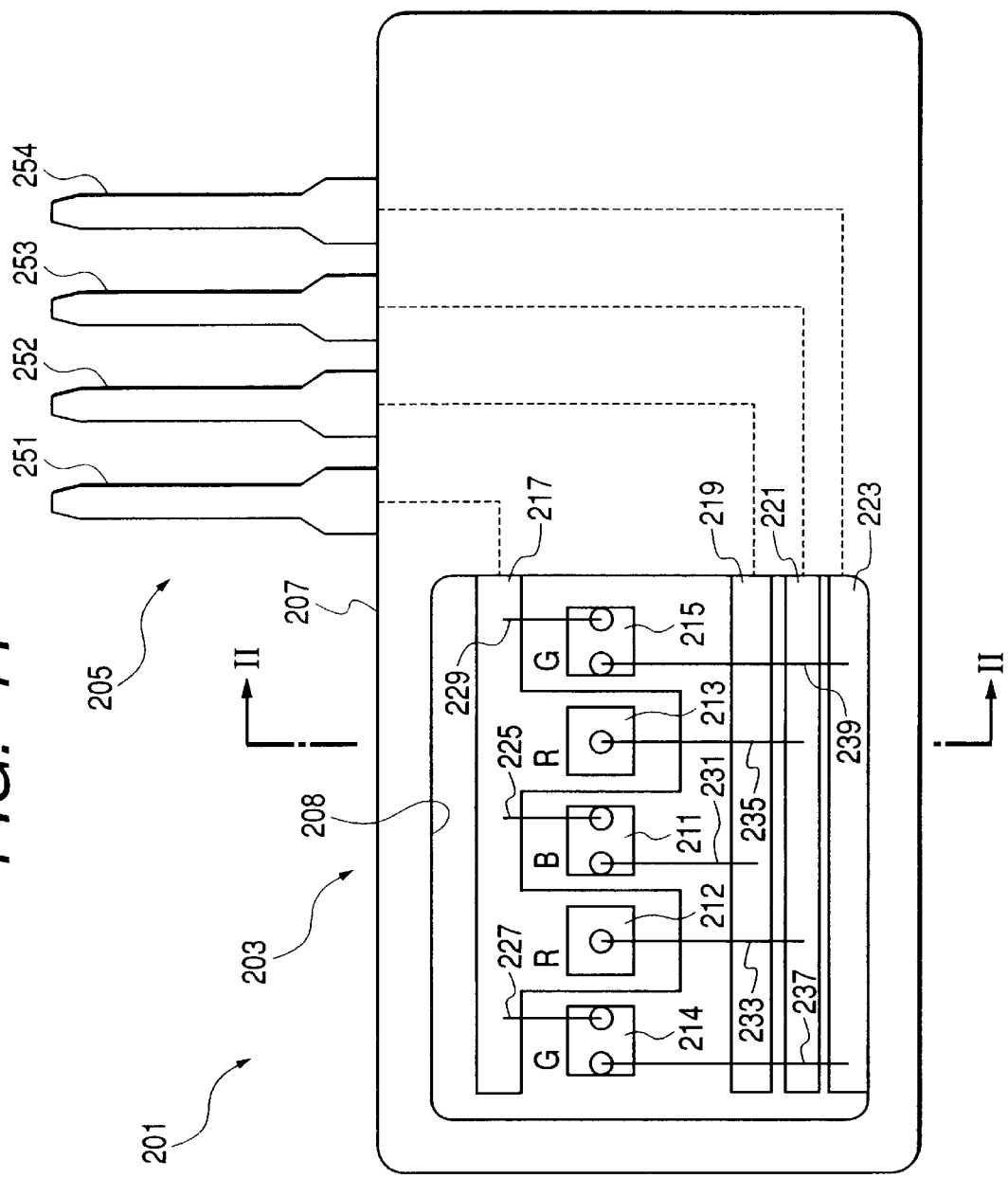
FIG. 11 is a front view showing a full-color light source unit according to a seventh embodiment of the present invention.

FIG. 11 is a front view of a full-color light source unit 201 according to the seventh embodiment of the present invention. The full-color light source unit 201 comprises a light source portion 203, and a connector portion 205.

A casing 207 has an opening portion 208 through which the light source portion 203 is exposed. Five connection pins 251 to 254 are protruded from an upper edge of the casing 207. The connector portion 205 is constituted by the connection pins 251 to 254.

For the light source portion 203, light-emitting systems according to the aforementioned first to sixth embodiments may be used.

Figure 12:
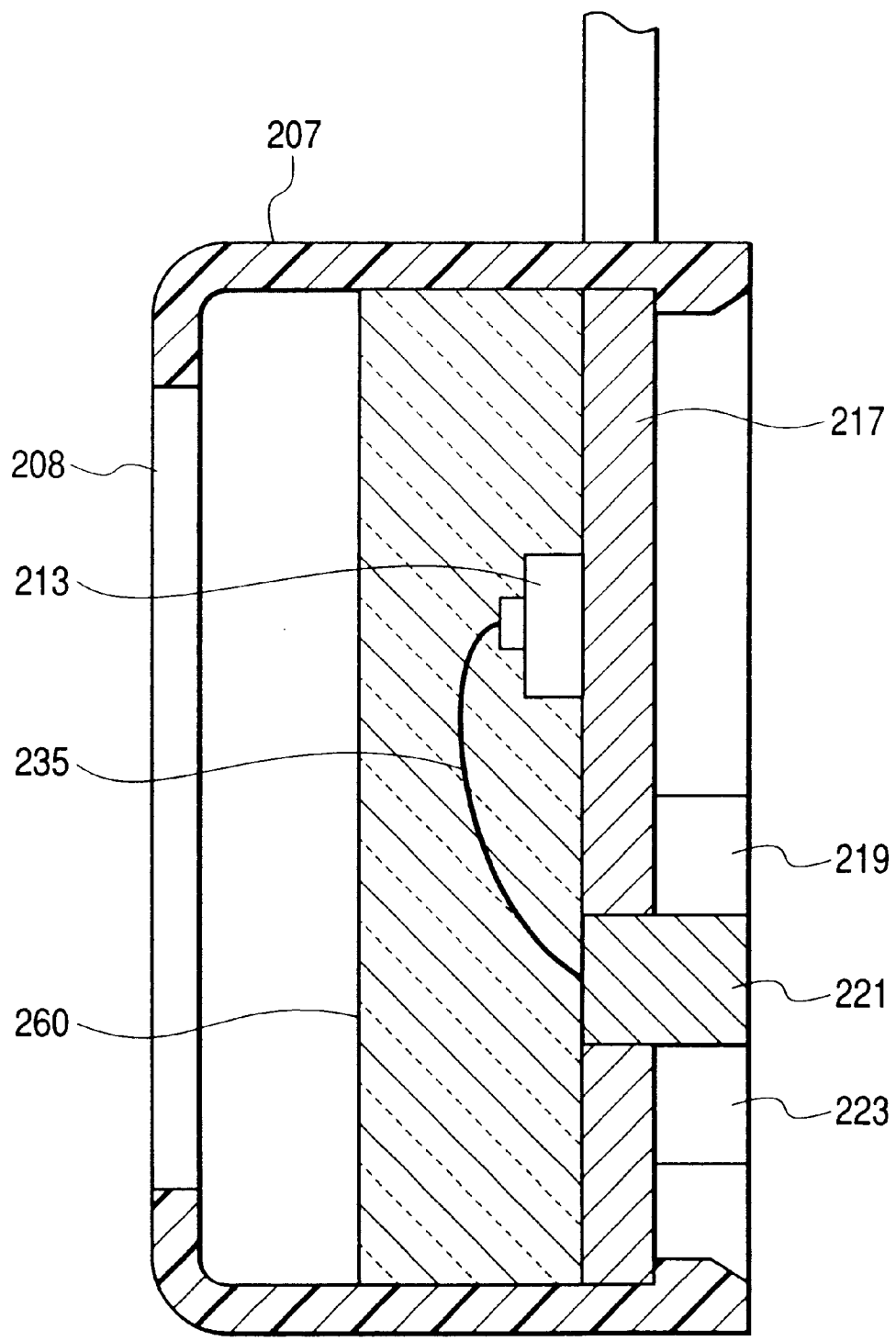
FIG. 12 is a sectional view taken along the line II—II in FIG. 11.
Figure 18:
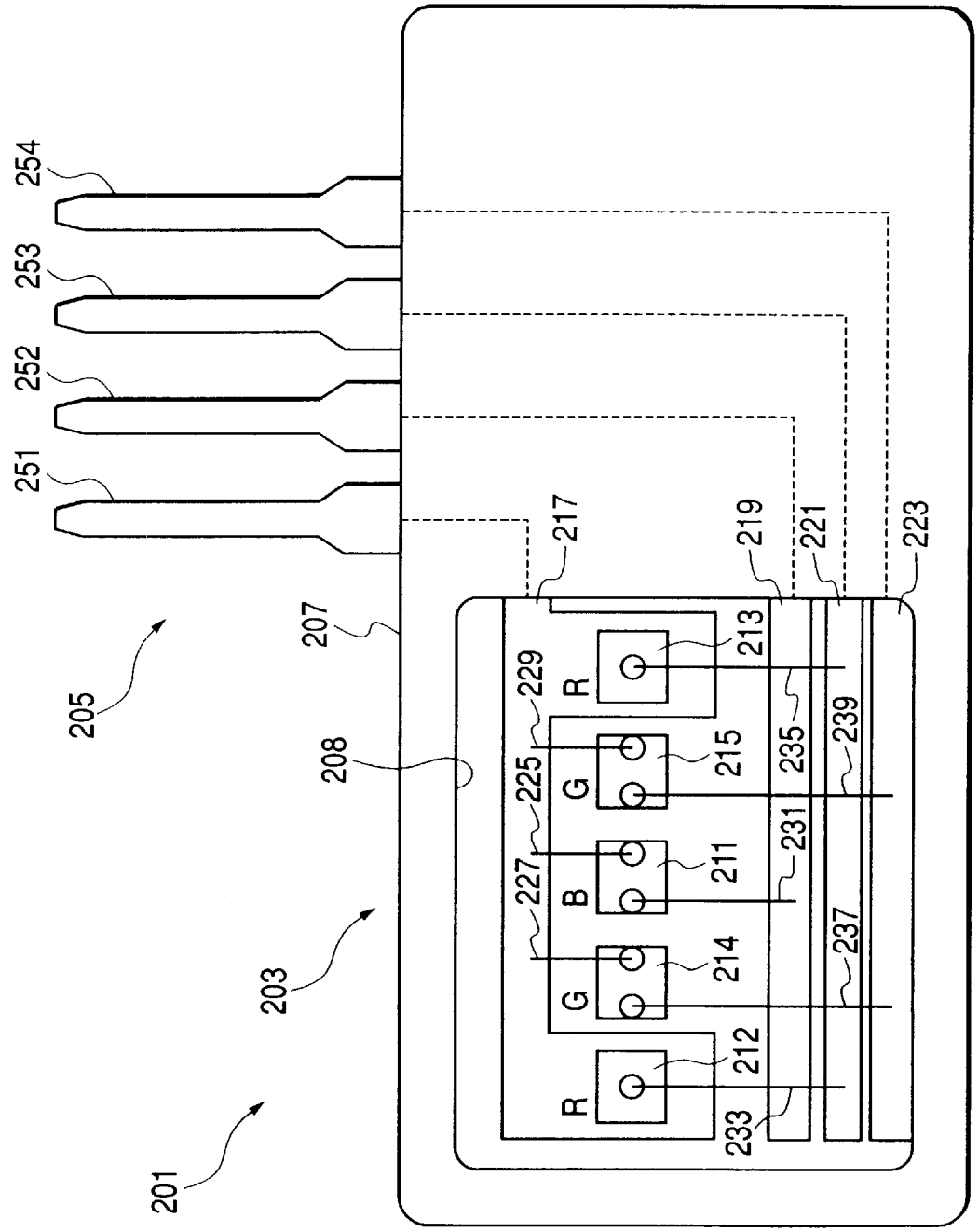
FIG. 18 is a front view showing a modified unit of the full-color light source unit shown in FIG. 11.
Figure 19:
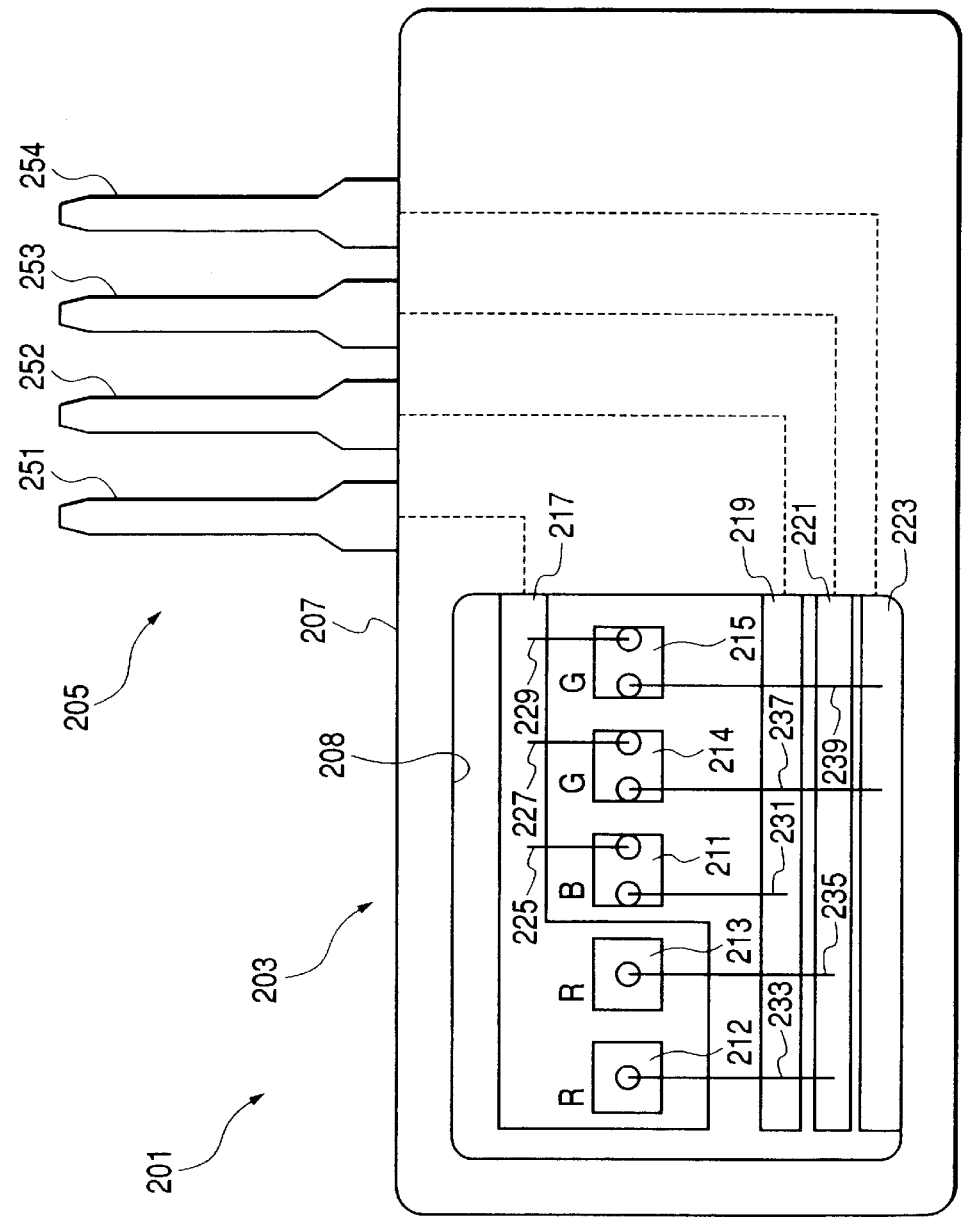
FIG. 19 is a front view showing another modified unit of the full-color light source unit shown in FIG. 11.

A blue LED 211 is arranged in the center of the light source portion 203 according to the present invention. Red LEDs 212 and 213 are arranged on the both sides of the blue LED 211. Green LEDs 214 and 215 are arranged on the outer sides of the red LEDs 212 and 213 respectively. In each of the red LEDs (for example, SOA-350N provided by Showa Denko K.K.), a substrate can be used as a negative electrode. Hence, as shown in FIGS. 11 and 12, the respective substrates of the red LEDs 212 and 213 are connected to a base electrode 217 of the light source portion 203. Respective n-type electrodes of the blue and green LEDs 211, 214 and 215 are connected to the base electrode 217 by bonding wires 225, 227 and 229 respectively. A p-type electrode of the blue LED 211 is connected to a second electrode 219 by a bonding wire 231. Similarly, p-type electrodes of the red LEDs 212 and 213 are connected to a third electrode 221 by bonding wires 233 and 235 respectively. P-type electrodes of the green LEDs 214 and 215 are connected to a fourth electrode 223 by bonding wires 237 and 239 respectively. Incidentally, arrangement order of the blue LED 211, the green LEDs 214, 215, and the red LEDs 212, 213 can be changed as shown in FIGS. 18 and 19.

As shown in FIG. 12, each of the LEDs 211 to 215 is covered with a transparent resin material (such as epoxy resin) 260.

Figure 13:
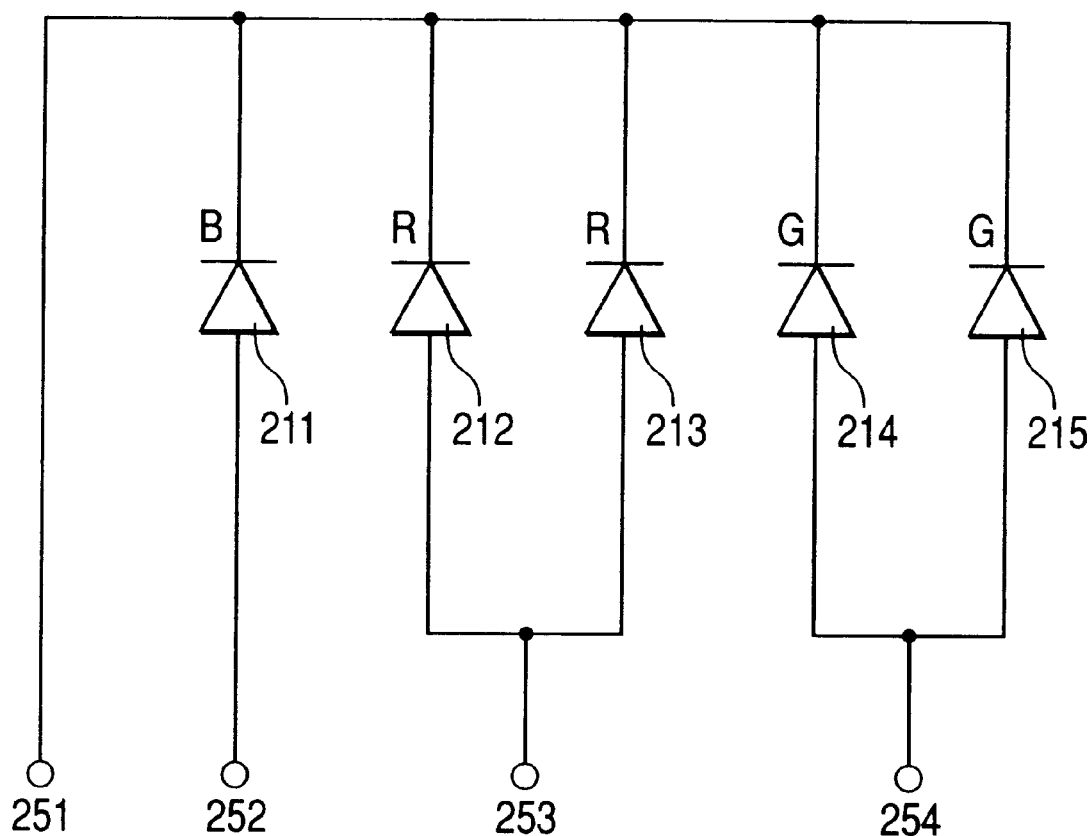
FIG. 13 is a circuit diagram of the full-color light source unit.

The base, second, third and fourth electrodes 217, 19, 221 and 223 are connected to the connection pins 251, 252, 253 and 254 respectively. Incidentally, FIG. 13 is a circuit diagram showing the full-color light source unit according to this embodiment.

Figure 14:
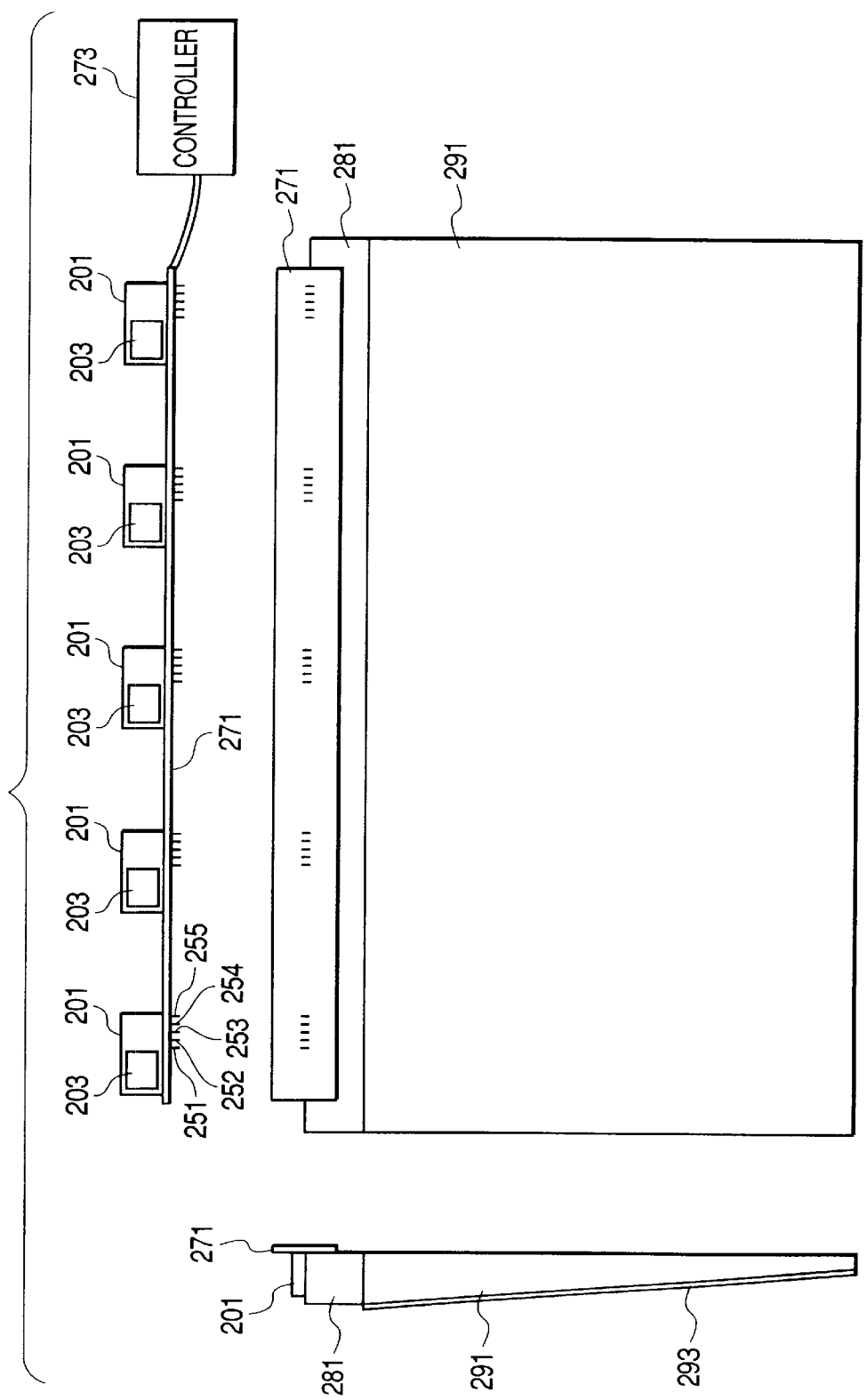
FIG. 14 is a surface light source according to an eighth embodiment of the present invention.

FIGS. 14A to 14C show an example of a surface light source in which full-color light source units 201 as described above are incorporated. FIG. 14A is a plan view of the surface light source; FIG. 14B is a front view thereof; and FIG. 14C is a side view thereof.

In this embodiment, five full-color light source units 201 are used. The connection pins 251 to 254 are inserted into through-holes formed in a substrate 271 and are soldered, so that the respective full-color light source units 1 are fixed to the substrate 271 and, at the same time, are electrically connected to wiring patterns of the substrate 271. A controller 273 is adapted to control the respective LEDs of the full-color light source units 201 individually for every similar color. Hence, when any one of the LEDs deteriorates earlier than expected, the other LEDs can be controlled to always develop desired white. It is a matter of course that the respective LEDs may be controlled to develop any optional color.

The light source portions 203 of the full-color light source units 201 are arranged opposite to an upper surface of a light mixing portion 281. The light mixing portion 281 is a rod-like plate having a transparent resin (such as methacrylic resin), and a light diffusing material (such as mica) dispersed in the transparent resin. Light components emitted from the respective LEDs and made incident into the light mixing portion 81 from its upper surface are diffused by the light diffusing material and mixed together. As a result, white light is made incident into an upper edge of a surface light guide portion 291 from the lower surface of the light mixing portion 281. Side surfaces of the light mixing portion 281 are provided as white-printed reflection surfaces to achieve prevention of light leakage out of the side surfaces and improvement of light diffusing efficiency. Alternatively, the side surfaces may be roughened to serve as reflection surfaces.

As shown in FIG. 14C, the surface light guide portion 91 has a back surface inclined. A reflection surface 293 is provided as a roughened surface. Roughening the back surface promotes irregular reflection of light to attain more sufficient mixing of light components emitted from the respective LEDs of the full-color light source units 201. The back surface is inclined so that the surface light guide portion 291 becomes thinner as the location in the surface light guide portion 291 becomes farther from the light entrance surface. Hence, light reflecting efficiency of the surface light guide portion 291 toward the frontal light-emitting surface is improved and, at the same time, uniformity of light-emitting density in the frontal light-emitting surface is attained. Side and lower edges of the surface light guide portion 291 are also provided as reflection surfaces to achieve prevention of light leakage out of the side and lower edges and improvement of light diffusing efficiency.

In the surface light source as configured as described above according to this embodiment, blue, green and red light components emitted from the respective LEDs of the full-color light source units 201 are mixed together in the light mixing portion 281 to thereby generate white light. That is, the full-color light source units 201 and the light mixing portion 81 constitute a full-color light source.

The white light generated by the light mixing portion 81 is made incident into the surface light guide portion 291 from the upper edge thereof. The white light made incident into the surface light guide portion 291 is reflected by the reflection surface 293 on the back of the surface light guide portion 291 and emitted from the frontal light-emitting portion. Thus, the frontal light-emitting portion emits white light. The white light emitted from the frontal light-emitting portion contains all light components with three primary colors (RGB) of light, inclusive of red light component. Hence, the white light is preferably used for back-lighting or front-lighting of a full-color liquid-crystal panel.

In the light source portion 3 of each full-color light source unit 201, red LEDs 212 and 213 and green LEDs 214 and 215 larger in number than one blue LED 211 are arranged with the blue LED 11 disposed as the center of the arrangement. Hence, even in the case where the respective LEDs are made to emit light with the rated power, that is, with nearly full power, any specific color tone is prevented from becoming intensive. Hence, white light can be emitted efficiently.

In the light source portion 203 of each full-color light source unit 1 in this embodiment, the red LEDs 212 and 213 and the green LEDs 214 and 215 are arranged symmetrically with respect to the blue LED 11 disposed as the center. Hence, light mixing in the light mixing portion is promoted because different colors are alternated compared with the case where colors of the same stock are arranged continuously. Moreover, it becomes easy to lay bonding wires for the respective LEDs because the red LEDs 212 and 213 each having only one electrode on the front side are disposed between the blue LED 211 and the green LEDs 214 and 215.

Figure 15:
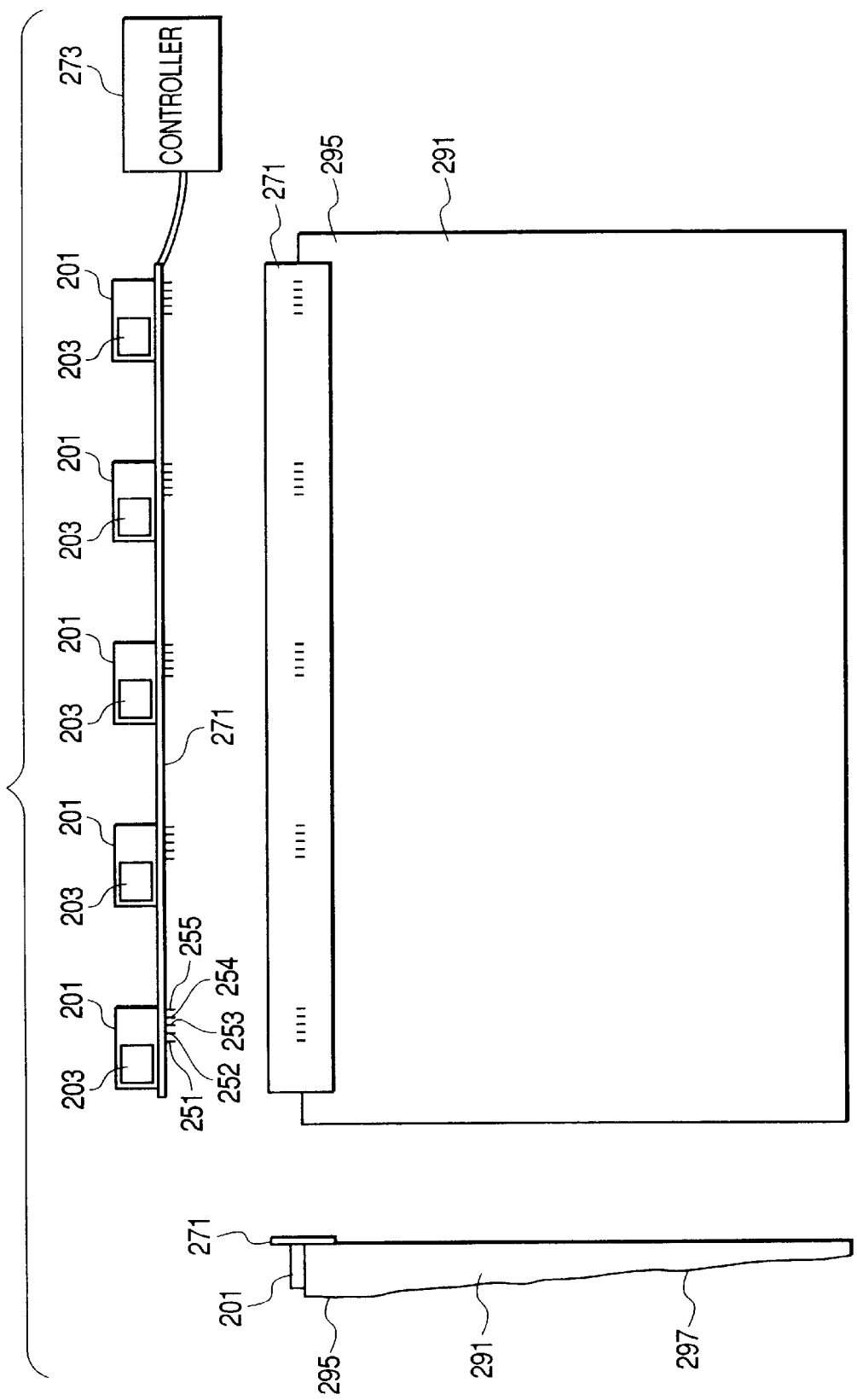
FIG. 15 is a surface light source according to a ninth embodiment of the present invention.

FIGS. 15A to 15C show a surface light source according to the ninth embodiment of the present invention. In this embodiment, parts the same as those in FIGS. 14A to 14C are referenced correspondingly so that the description of the parts is omitted here.

In the surface light source according to the embodiment shown in FIGS. 15A to 15C, the light mixing portion 281 shown in FIGS. 14A to 14C is omitted and an attachment portion 295 for attaching the full-color light source units 201 is integrally provided on the upper edge of the surface light guide portion 291. Further, the back surface 293 of the surface light guide portion 291 is provided as a rough surface so that light components emitted from the full-color light source units 201 can be reflected irregularly and mixed more efficiently.

According to the surface light source configured as shown in FIGS. 15A to 15C, cost reduction can be achieved because the number of parts can be reduced compared with the surface light source shown in FIGS. 14A to 14C.

A surface light source 101 according to the tenth embodiment of the present invention will be described below with reference to FIG. 16.

The surface light source 101 comprises a full-color light source unit 103, a light mixing portion 110, and a surface light guide portion 130.

The light source proposed in this embodiment is particularly characterized in the light mixing portion 110. The full-color light source unit 103 having LEDs is not limited to a unit having all RGB LEDs. For example, the full-color light source unit 103 may be of the type of forming white light by combination of a blue LED and a fluorescent material.

The case where the surface light source 101 in this embodiment is adapted for back-lighting or front-lighting of a full-color liquid-crystal panel will be described below.

In this embodiment, any arrangement of blue, red and green LEDs can be used because the light mixing ability of the light mixing portion is improved. It is a matter of course that the number of blue LEDs is preferably set to be smaller than the number of any other kind of LEDs from the point of view of driving the respective LEDs with the rated power to secure high efficiency. The full-color light source unit 1 according to the previously described embodiment may be used especially preferably.

The light mixing portion 110 is made of a light-transmissible material (such as methacrylic resin). The light mixing portion 110 is constituted by three portions, namely, a light condensing portion 111, a diffusing portion 115, and a light distributing portion 117. The light condensing portion 111 has a reflection surface 113. The reflection surface 113 reflects light components emitted from the respective LEDs of the full-color light source unit 103 toward the diffusing portion 115. Use of a rough surface as the reflection surface 113 has an effect that light components emitted from the respective LEDs of the full-color light source unit 103 are mixed together. The reflection surface 113 may be shaped like a Fresnel lens so that light components emitted from the respective LEDs of the full-color light source unit 103 are converged at the diffusing portion 115. That is, when the focal point of the Fresnel lens is placed in the diffusing portion 115, mixing of light components emitted from the respective LEDs is promoted. A white-printed surface may be used as the reflection surface.

The diffusing portion 115 contains a light diffusing material such as mica dispersed therein. Hence, light components emitted from the respective LEDs and condensed at the diffusing portion 115 are diffused to thereby form white light. The white light is made incident into a light entrance surface 118 of the light distributing portion 117. The light distributing portion 117 has a reflection surface 119 inclined. The light made incident into the light distributing portion 117 from the light entrance surface 118 is reflected through the reflection surface 119 toward the light-emitting surface 120. Also the reflection surface 119 of the light distributing portion 117 is roughened or white-printed in the same manner as the reflection surface 113 of the light condensing portion 111. The reason why the reflection surface 119 is inclined is as follows. This is because the white light made incident into the light distributing portion 117 from the light entrance surface 118 is distributed into the light-emitting surface 120 side more efficiently and uniformly so that luminance can be kept uniform on the light-emitting surface 120 as a whole.

The surface light guide portion 130 has a back surface 135 provided as a reflection surface. Also the reflection surface is formed by a surface-roughening process or by a white-printing process. The white light emitted from the light-emitting surface 120 of the light distributing portion 117 is made incident into the surface light guide portion 130 from the upper edge (light entrance surface) 131 of the surface light guide portion 130. The light is emitted from a light-emitting surface 133 of the surface light guide portion 130 while reflected irregularly through the back surface 135. As a result, the light-emitting surface 133 is made to emit white light.

Figure 16:
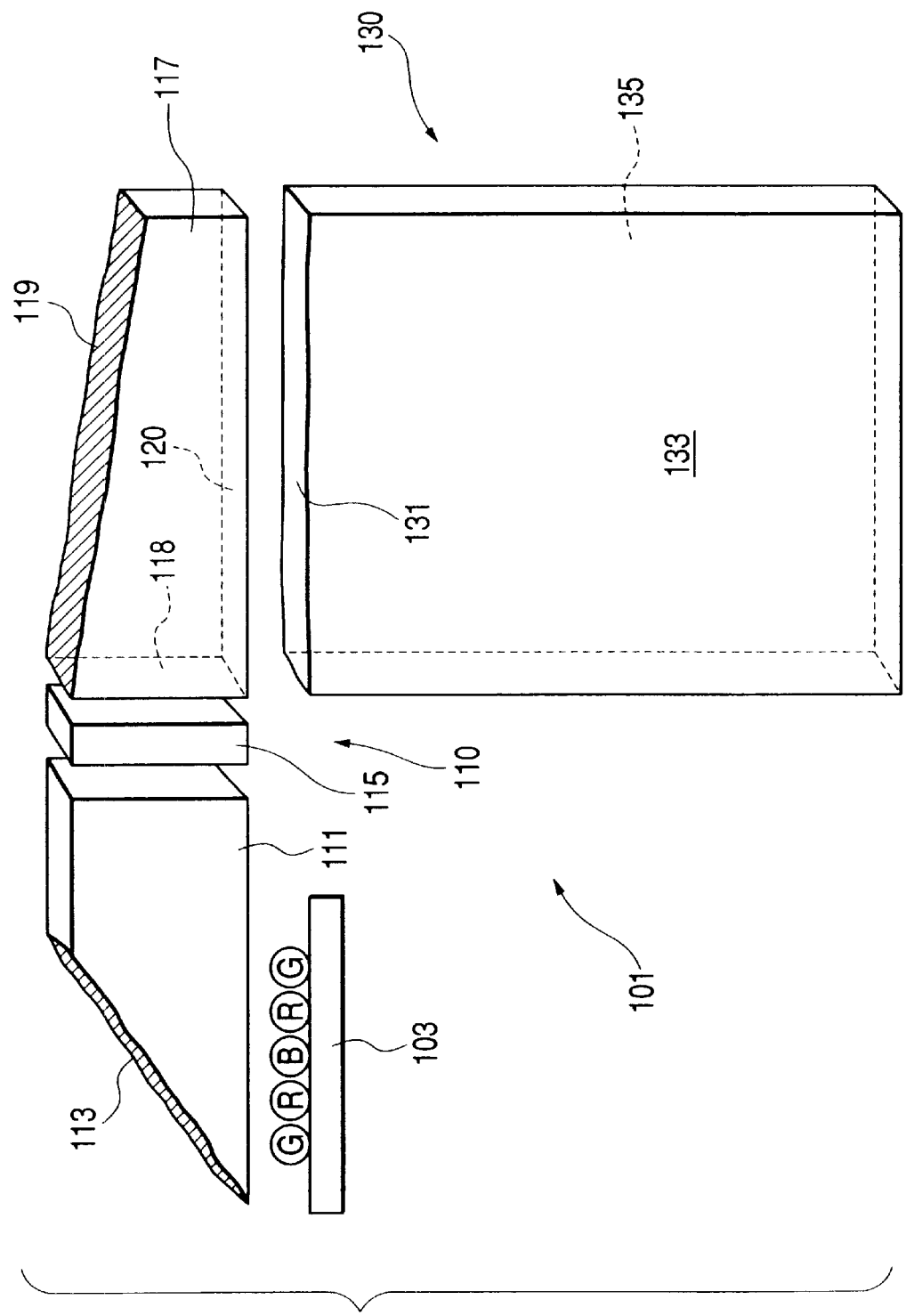
FIG. 16 is an exploded view showing the configuration of a surface light source according to a tenth embodiment of the present invention.

Although FIG. 16 shows the case where respective parts are separated for the sake of explanation, the respective parts are arranged to be close to one another in practical use. In the respective parts shown in FIG. 16, all surfaces inhibited from transmitting light are preferably provided as reflection surfaces to achieve prevention of light leakage out of the reflection surfaces and improvement of light diffusing efficiency.

A full-color light source unit 103 and a light mixing portion 110 may be provided additionally on the lower edge side of the surface light guide portion 130. In this case, the surface light guide portion 130 can be made to emit white light more uniformly with higher luminance.

In the surface light source 101 configured as shown in FIG. 16, the path of light in the light mixing portion 110 is elongated. Hence, light components emitted from the respective LEDs arranged in the full-color light source unit 103 can be mixed more securely to synthesize white light. Moreover, the light mixing portion 110 has the roughened reflection surfaces 113 and 119 in addition to the diffusing portion 115. Hence, a highly diffusing effect can be obtained.

In this embodiment, light emitted from the full-color light source unit 103 is bent by 180 degrees in the light mixing portion 110. That is, the full-color light source unit 103 and the surface light guide portion 130 are arranged in parallel to each other. It is a matter of course that the reflection surface 113 of the light condensing portion 111 may be omitted and a light source unit may be provided in place of the reflection surface 113.

A light mixing means may be considered to be constituted by a combination of the light condensing portion 111 and the diffusing portion 115. A full-color light source may be considered to be constituted by a combination of the light mixing means and the full-color light source unit 103. The full-color light source must be arranged opposite to the light entrance surface 118 of the light distributing portion 117. Hence, the position of the full-color light source is determined on the basis of the position of the light entrance surface 118 of the light distributing portion 117. In this embodiment, the light entrance surface 118 and the light-emitting surface 120 cross each other at nearly right angles. If the two surfaces become parallel to each other, this embodiment is substantially equalized to the embodiment shown in FIGS. 4A to 4C.

Figure 17:
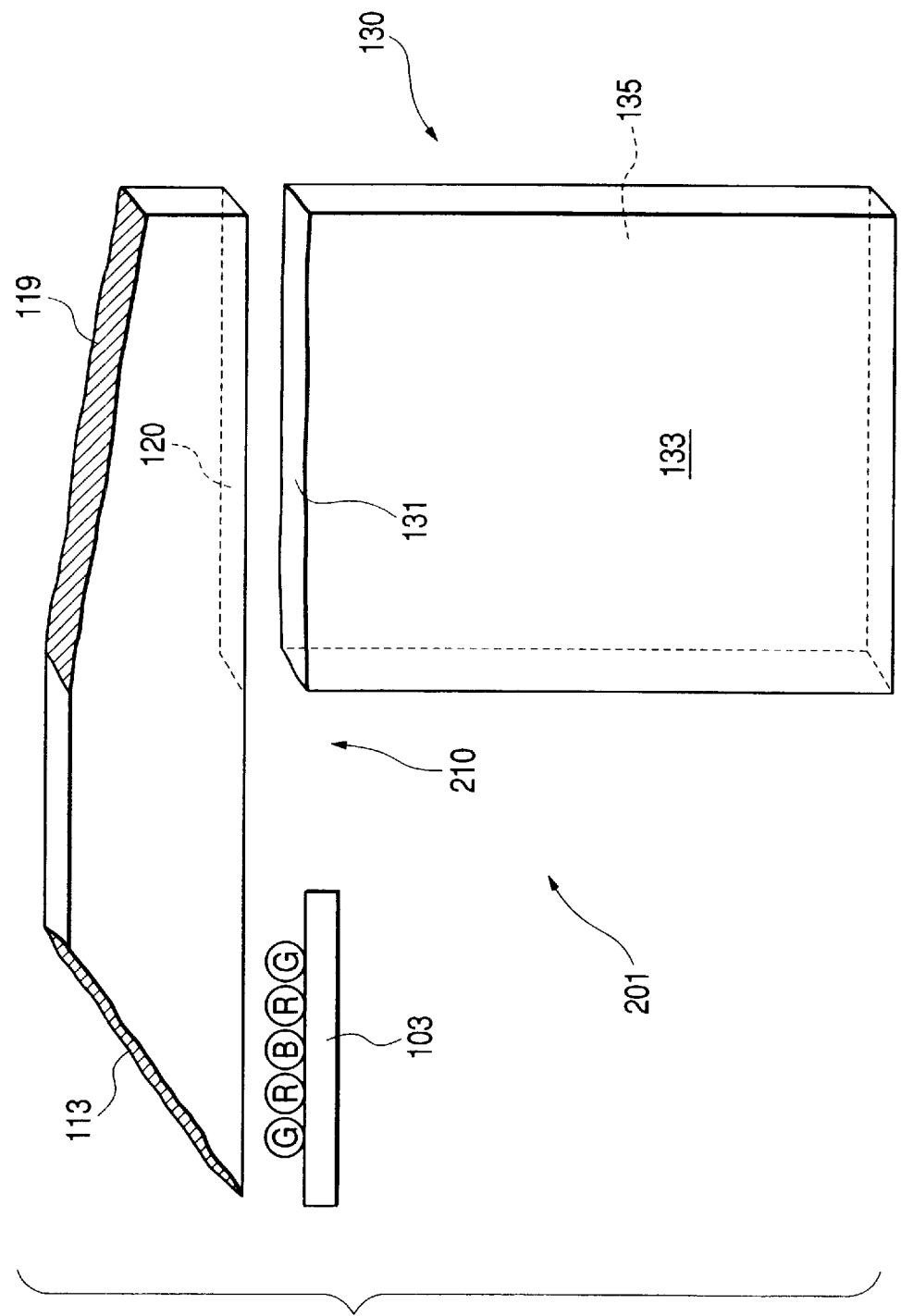
FIG. 17 is an exploded view showing the configuration of a surface light source according to an eleventh embodiment of the present invention.

FIG. 17 shows a surface light source 201 according to the eleventh embodiment of the present invention. In the surface light source according to this embodiment, parts the same as those in the surface light source according to the previously described embodiment of FIG. 16 are referenced correspondingly so that the description of the parts is omitted here.

The surface light source 201 according to this embodiment is formed so that the light condensing portion 111 and the light distributing portion 117 in the surface light source 101 shown in FIG. 16 are integrated with each other while the light mixing portion 110 is omitted. That is, the surface light source 201 comprises a full-color light source unit 103, a light mixing portion 210, and a surface light guide portion 130. The light mixing portion 210 has reflection surfaces 113 and 119. Light components emitted from the respective LEDs of the full-color light source unit 103 are mixed together on the basis of irregular reflection through the reflection surfaces 113 and 119. The mixed light is emitted from the light-emitting surface 120 of the light mixing portion 210 toward the surface light guide portion 130.

The surface light source 201 configured as shown in FIG. 17 can achieve reduction in size and weight and reduction in cost because the number of parts can be reduced compared with the surface light source 101 shown in FIG. 16.

Each of the surface light sources described above is disposed on the back surface of a full-color liquid crystal panel of a full-color display so as to be used as a back light. That is, the shape of the light emitting portion of the surface light source may be designed freely. If the width is reduced, there is provided a linear light source. Further if the area is made small, there can be provided a full-color point light source.

The full-color light source unit, the full-color light source, the light distributing portion, the light mixing portion and the light mixing means according to the present invention can be applied also to a linear light source in a full-color scanner.

The present invention is not limited to the description of the modes for carrying out the invention and the embodiments thereof at all. The present invention includes various changes and modifications that can be conceived easily by those skilled in the art without departing from the scope of claim.

The following items are disclosed.

(21) A surface light source comprising:
a full-color light source using LEDs as light sources;
a surface light guide portion; and
a light distributing portion for distributing light emitted from the full-color light source into a light entrance surface of the surface light guide portion substantially uniformly.

(22) A surface light source comprising:
a full-color light source using LEDs as light sources;
a light mixing portion for mixing light emitted from the full-color light source; and
a light distributing portion for substantially uniformly distributing light obtained from the light mixing portion.

(23) A surface light source according to the paragraph (21) or (22), wherein the full-color light source unit includes at least one blue LED; green LEDs larger in number than said blue LED; and red LEDs larger in number than said blue LED; and the surface light source further includes a light mixing means for mixing light emitted from the full-color light source unit.

(24) A surface light source according to the paragraph (23), wherein the light mixing means includes:
a light condensing portion for condensing light components emitted from the respective LEDs of the full-color light source unit and reflected irregularly; and
a diffusing portion for diffusing the condensed light.

(31) A surface light source comprising:
a surface light guide portion;
a light distributing portion including a light-emitting surface arranged opposite to the surface light guide portion, and a light entrance surface crossing the light-emitting surface, the light distributing portion being provided so that white light made incident into the light entrance surface is distributed into the light-emitting surface uniformly; and
a full-color light source for making white light incident into the light entrance surface of the light distributing portion.

(32) A surface light source according to the paragraph (31), wherein the light-emitting surface and the light entrance surface in the light distributing portion cross each other substantially at right angles.

(33) A surface light source according to the paragraph (31) or (32), wherein the full-color light source unit includes at least one blue LED; green LEDs larger in number than said blue LED; and red LEDs larger in number than said blue LED; and the surface light source further includes a light mixing means for mixing light emitted from the full-color light source unit.

(34) A surface light source according to the paragraph (33), wherein the light mixing means has:
a light condensing portion for condensing light components emitted from the respective LEDs of the full-color light source unit and reflected irregularly; and
a diffusing portion for diffusing the condensed light.

(40) A linear light source comprising:
a full-color light source unit including at least one blue LED; green LEDs larger in number than said blue LED; and
red LEDs larger in number than said blue LED; and the surface light source further includes a light mixing portion.

(50) A point light source comprising:
a full-color light source unit including at least one blue LED; green LEDs larger in number than said blue LED; and red LEDs larger in number than said blue LED; and the surface light source further includes a light mixing portion.

What is claimed is:

1. A full-color light source unit comprising:
at least one blue LED;
at least one green LED; and
a plurality of red LEDs larger in number than said at least one blue LED,
wherein each of said blue, green and red LEDs is provided as a bare chip.

2. A unit according to claim 1, wherein said LEDs are packed in a package.

3. A unit according to claim 1, wherein said plurality of LEDs are classified into a first group of said blue LED and said green LED and a second group of red LEDs, each of said first group of LEDs having first and second electrodes on a light-emitting surface side, each of said second group of LEDs having a first electrode on said light-emitting surface side and a second electrode on a side opposite to said light-emitting surface side, and
said first group of LEDs and said second group of LEDs are arranged alternately in a line on a substrate.

4. A full-color light source unit comprising:
at least one blue LED;
at least one green LED; and
a plurality of red LEDs larger in number than said at least one blue LED,
wherein said blue, green and red LEDs are arranged with said blue LED disposed as a center of arrangement.

5. A unit according to claim 4, wherein said red LEDs are arranged outside said blue LED, and said green LED is arranged further outside said red LEDs.

6. A unit according to claim 4, wherein all the LEDs except said blue LED are arranged symmetrically with respect to said blue LED disposed as the center of the arrangement.

7. A unit according to claim 4, wherein said red LEDs are arranged on one side and said green LED is arranged on the other side with said blue LED disposed as the center of the arrangement.

8. A full-color light source unit comprising:
at least one blue LED;
at least one green LED; and
a plurality of red LEDs larger in number than said at least one blue LED,
wherein said blue, green and red LEDs are arranged in a straight line.

9. A full-color light source comprising:
a full-color light source unit according to claim 1; and
a light mixing portion for mixing light components emitted from said respective LEDs of said full-color light source unit with each other to thereby emit the mixed light.

10. A surface light source comprising:
a light mixing portion according to claim 9; and
a surface light guide portion.

11. A display body comprising:
a surface light source according to claim 10; and
a liquid-crystal display portion.

12. A surface light source comprising:
at least one full-color light source unit comprising:
at least one blue LED;
at least one green LED; and
a plurality of red LEDs larger in number than said at least one blue LED,
a light mixing portion for mixing light emitted from said respective LEDs of said full-color light source unit;
a surface light guide portion; and
a light distributing portion for leading the mixed light from said light mixing portion to said surface light guide portion to thereby make said surface light guide portion emit light substantially uniformly.

13. A light-emitting system comprising a plurality of light-emitting devices mounted on a substrate, wherein said plurality of light-emitting devices include a first group of light-emitting devices and a second group of light-emitting devices, each of said first group of light-emitting devices having first and second electrodes on a light-emitting surface side, each of said second group of light-emitting devices having a first electrode on said light-emitting surface side and a second electrode on a side opposite to said light-emitting surface side; and said first group of light-emitting devices and said second group of light-emitting devices are arranged alternately in a line on said substrate.

14. A light-emitting system according to claim 13, wherein said substrate is provided with individual leads which are formed in regions perpendicular to said light-emitting devices arranged in a line and to which said first electrodes of said light-emitting devices are wire-bonded respectively.

15. A light-emitting system according to claim 13, wherein said substrate is a printed-circuit board in which a plurality of leads to be connected to said first and second electrodes of said respective light-emitting devices are printed on an electrically insulating base by a circuit-printing technique.

16. A light-emitting system according to claim 13, wherein said substrate is a lead frame-structural substrate formed by a technique in which an electrically insulating material is injected into a mold in a condition that a lead frame to be connected to said first and second electrodes of said respective light-emitting devices is arranged in said mold.

17. A light-emitting system according to claim 13, wherein said first group of light-emitting devices include one blue light-emitting device, and one or more green light-emitting devices; and said second group of light-emitting devices include two or more red light-emitting devices.

18. A light-emitting system according to claim 13, wherein said first group of light-emitting devices include two green light-emitting devices, and one blue light-emitting device;

said second group of light-emitting devices include two red light-emitting devices; and said two red light-emitting devices, said two green light-emitting devices and said one blue light-emitting device are arranged on said substrate in order of one green light-emitting device, one red light-emitting device, one blue light-emitting device, one red light-emitting device and one green light-emitting device.

19. A light-emitting system according to claim 13, wherein said substrate includes a reflection-housing, and a sealing member, said reflection housing having an opening portion provided on a side of mounting of said light-emitting devices and provided so as to surround said light-emitting devices, said sealing member being made of a light-transmissible material for sealing said light-emitting devices and filling said opening portion of said reflection housing.

20. A light-emitting system according to claim 13, wherein said substrate is provided with individual leads which are formed in regions between adjacent ones of said light-emitting devices arranged in a line and to which said first electrodes of said light-emitting devices are wire-bonded respectively.

21. A light-emitting system according to claim 20, wherein each of said individual leads is formed to extend from a front surface of said substrate to a side surface of said substrate.

22. A light-emitting system comprising a plurality of light-emitting devices mounted on a substrate, wherein said substrate includes a common lead being common to said light-emitting devices, and individual leads being peculiar to said light-emitting devices respectively, said common and individual leads being formed as predetermined patterns on a front surface of an electrically insulating base; and each of said common lead and said individual leads has a portion extended to one side surface of said electrically insulating base, wherein said substrate is a lead frame-structural substrate formed by a technique in which an electrically insulating material is injected into a mold in a condition that a lead frame corresponding to said common and individual leads is arranged in said mold.

23. A light-emitting system comprising a plurality of light-emitting devices mounted on a substrate, wherein said substrate includes a common lead being common to said light-emitting devices, and individual leads being peculiar to said light-emitting devices respectively, said common and individual leads being formed as predetermined patterns on a front surface of an electrically insulating base; and each of said common lead and said individual leads has a portion extended to one side surface of said electrically insulating base, wherein said front surface of said electrically insulating base has a linear arrangement region in which said light-emitting devices are arranged in a line; and said individual leads are constituted by "L"-shaped leads and linear leads arranged alternately, each of said "L"-shaped leads having a bonding lead region extended on said arrangement region, and a connection lead region for connecting said bonding lead region to said extended portion, each of said linear leads being extended from said arrangement region toward said extended portion.

24. A light-emitting system comprising a plurality of light-emitting devices mounted on a substrate, wherein said light-emitting devices include a first group of light-emitting devices capable of emitting light with a predetermined heating value, and a second group of light-emitting devices capable of emitting light with a heating value smaller than said predetermined heating value; and said first group of light-emitting devices and said second group of light-emitting devices are arranged in a line on said substrate so that said first group of light-emitting devices are not adjacent to one another.

25. A light-emitting system according to claim 24, wherein said substrate includes a reflection housing and a sealing member, said reflection housing having an opening portion on a side of mounting of said light-emitting devices so as to surround said light-emitting devices, said sealing member being made of a light-transmissible material for sealing said light-emitting devices and filling said opening portion of said reflection housing.

26. A light-emitting system comprising a plurality of light-emitting devices mounted on a substrate, wherein said light-emitting devices include a first group of light-emitting devices with a predetermined height, and a second group of light-emitting devices with a height lower than said predetermined height; and said first group of light-emitting devices and said second group of light-emitting devices are arranged in a line on said substrate so that said first group of light-emitting devices are not adjacent to one another.

27. A light-emitting system according to claim 26, wherein said substrate includes a reflection housing and a sealing member, said reflection housing having an opening portion on a side of mounting of said light-emitting devices so as to surround said light-emitting devices, said sealing member being made of a light-transmissible material for sealing said light-emitting devices and filling said opening portion of said reflection housing.

28. A full-color light source unit comprising:

at least one blue LED;

at least one green LED; and a plurality of red LEDs larger in number than said at least one blue LED, wherein said plurality of blue, green and red LEDs are classified into a first group of said at least one blue LED and said at least one green LED and a second group of said red LEDs, each of said first group of LEDs being capable of emitting light with a predetermined heating value, and each of said second group of LEDs being capable of emitting light with a heating value smaller than said predetermined heating value, and wherein said first group of LEDs and said second group of LEDs are arranged in a line on a substrate so that said first group of LEDs are not adjacent to one another.

29. A full-color light source unit comprising:

at least one blue LED;

at least one green LED; and a plurality of red LEDs larger in number than said at least one blue LED, wherein said plurality of blue, green and red LEDs are classified into a first group of said at least one blue LED and said at least one green LED and a second group of said red LEDs, each of said first group of LEDs has a predetermined height, and each of said second group of LEDs has a height higher than said predetermined height, and wherein said first group of LEDs and said second group of LEDs are arranged in a line on a substrate so that said first group of LEDs are not adjacent to one another.

30. A fill-color light source unit comprising:

at least one blue LED;

at least one green LED;

a plurality of red LEDs larger in number than said at least one blue LED; and a plurality of green LEDs larger in number than said at least one blue LED.

* * * * *